US012588388B2

(12) United States Patent
Jung et al.

(10) Patent No.: US 12,588,388 B2
(45) Date of Patent: Mar. 24, 2026

(54) DISPLAY DEVICE AND TOUCH DISPLAY PANEL

(71) Applicant: Samsung Display Co., LTD., Yongin-si (KR)

(72) Inventors: Hae Goo Jung, Yongin-si (KR); Yeon Shil Jung, Yongin-si (KR); Soo Kyung Kim, Yongin-si (KR); Yeon Ji Bae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 18 days.

(21) Appl. No.: 18/213,144

(22) Filed: Jun. 22, 2023

(65) Prior Publication Data

US 2024/0057437 A1     Feb. 15, 2024

(30) Foreign Application Priority Data

Aug. 9, 2022    (KR) ........................ 10-2022-0099561

(51) Int. Cl.
| | |
|---|---|
| *H10K 59/40* | (2023.01) |
| *G06F 3/041* | (2006.01) |
| *G06F 3/044* | (2006.01) |
| *H10K 59/121* | (2023.01) |
| *H10K 59/122* | (2023.01) |
| (Continued) | |

(52) U.S. Cl.
CPC ........... *H10K 59/40* (2023.02); *G06F 3/0412* (2013.01); *G06F 3/044* (2013.01); *H10K 59/1213* (2023.02); *H10K 59/122* (2023.02);

*H10K 59/131* (2023.02); *H10K 59/873* (2023.02); *G06F 2203/04102* (2013.01); *H10K 2102/311* (2023.02)

(58) Field of Classification Search
None
See application file for complete search history.

(56) References Cited

U.S. PATENT DOCUMENTS

| | | | |
|---|---|---|---|
| 10,497,770 B2 | 12/2019 | Lee et al. | |
| 11,355,526 B2 | 6/2022 | Park et al. | |
| | (Continued) | | |

FOREIGN PATENT DOCUMENTS

| | | |
|---|---|---|
| KR | 10-2020-0066499 A | 6/2020 |
| KR | 10-2318145 B1 | 10/2021 |
| | (Continued) | |

*Primary Examiner* — Christopher R Lamb
(74) *Attorney, Agent, or Firm* — Womble Bond Dickinson (US) LLP

(57) ABSTRACT

A display device includes: a substrate including a display area at a front surface and a non-display area at a periphery of the display area, wherein the non-display area includes a bending area having at least a portion bent toward a rear surface; a first metal layer on the substrate, the first metal layer overlapping with a contact hole at an out side of the bending area in the non-display area; a first via layer as an organic layer, located over the first metal layer, the first via layer including the contact hole; a second metal layer on the first via layer, the second metal layer being electrically connected to the first metal layer in the contact hole; and an inorganic layer on the second metal layer, wherein at least a portion of one side end of the inorganic layer, which is in the non-display area, is at an outside of the bending area and an area on the contact hole.

36 Claims, 23 Drawing Sheets

(51) Int. Cl.
    H10K 59/131     (2023.01)
    H10K 59/80     (2023.01)
    H10K 102/00     (2023.01)

(56)           References Cited

U.S. PATENT DOCUMENTS

| | | | |
|---|---|---|---|
| 2012/0100647 A1* | 4/2012 | Kim | H10K 71/80 |
| | | | 257/E33.059 |
| 2017/0262109 A1* | 9/2017 | Choi | G06F 3/04164 |
| 2018/0151662 A1* | 5/2018 | Rhe | H10K 59/40 |
| 2019/0095007 A1* | 3/2019 | Jeong | H10K 59/873 |
| 2020/0152707 A1* | 5/2020 | Won | H10K 59/40 |
| 2022/0131113 A1 | 4/2022 | Jung et al. | |
| 2022/0350457 A1* | 11/2022 | Li | G06F 3/0446 |

FOREIGN PATENT DOCUMENTS

| | | |
|---|---|---|
| KR | 10-2381286 B1 | 3/2022 |
| KR | 10-2022-0056284 A | 5/2022 |

* cited by examiner

DISPLAY DEVICE AND TOUCH DISPLAY PANEL

CROSS-REFERENCE TO RELATED APPLICATION

The present application claims priority to and the benefit of Korean patent application No. 10-2022-0099561 filed on Aug. 9, 2022, in the Korean Intellectual Property Office, the entire disclosure of which is incorporated herein by reference.

BACKGROUND

1. Field

Aspects of some embodiments of the present disclosure generally relate to a display device and a touch display panel.

2. Description of the Related Art

With the development of information technologies, the importance of display device that provide a connection medium between a user and information increases. Accordingly, display devices such as a liquid crystal display device and an organic light emitting display device are increasingly used.

It has been a problem in the art to increase a ratio of a display area in which an image is entirely displayed in a display device. In a method of increasing the ratio of the display area, a portion of a non-display area in which any image is not displayed in a display panel is bent toward a rear surface of the display panel, thereby further increasing the ratio of the display area in which the image is displayed.

However, a problem that a metal layer of the display panel is oxidized and corroded at the periphery of the area in which the display panel is bent may repeatedly occur.

The above information disclosed in this Background section is only for enhancement of understanding of the background and therefore the information discussed in this Background section does not necessarily constitute prior art.

SUMMARY

Aspects of some embodiments include a display device and a touch display panel, in which a problem that a metal layer is oxidized at the periphery of a bending area is relatively reduced.

According to some embodiments of the present disclosure, there is provided a display device including: a substrate including a display area at a front surface and a non-display area located at the periphery of the display area, wherein the non-display area includes a bending area having at least a portion bent toward a rear surface; a first metal layer located on the substrate, the first metal layer being located while overlapping with a contact hole located at an outside of the bending area in the non-display area; a first via layer as an organic layer, located over the first metal layer, the first via layer including the contact hole; a second metal layer located on the first via layer, the second metal layer being electrically connected to the first metal layer in the contact hole; and an inorganic layer located on the second metal layer, wherein at least a portion of one side end of the inorganic layer, which is located in the non-display area, is located at an outside of the bending area and an area on the contact hole.

According to some embodiments, the first metal layer and the second metal layer may be configured with a metal having a triple layer structure.

According to some embodiments, the display device may include a passivation layer located over the inorganic layer. According to some embodiments, one side end of the passivation layer may be located at an outside of the bending area.

According to some embodiments, the passivation layer may cover the one side end of the inorganic layer.

According to some embodiments, the one side end of the passivation layer may be located between the one side end of the inorganic layer and the bending area.

According to some embodiments, the one side end of the passivation layer may be located at an outside of the bending area, the contact hole, and the one side end of the inorganic layer.

According to some embodiments, the display device may further include a second via layer as an organic layer, located over the second metal layer. According to some embodiments, the inorganic layer may be located on the second via layer.

According to some embodiments, the inorganic layer may contact the second via layer.

According to some embodiments, the display device may further include a pixel defining layer located on the second via layer, the pixel defining layer defining a plurality of pixels in the display area. According to some embodiments, in the non-display area, the one side end of the inorganic layer may be located at an opposite side of the pixel defining layer.

According to some embodiments, the inorganic layer may be located on the pixel defining layer in the display area.

According to some embodiments, the one side end of the passivation layer may be located at an opposite side of the pixel defining layer in the non-display area.

According to some embodiments, the one side end of the passivation layer may be located on the pixel defining layer and be located at an outside of the bending area in the non-display area. According to some embodiments, the passivation layer may include a first inclined surface formed corresponding to a thickness of the pixel defining layer.

According to some embodiments, at least one of the plurality of pixels may include at least one light emitting element. According to some embodiments, the light emitting element may include a first electrode located on the second via layer, a light emitting layer located on the pixel defining layer, and a second electrode located on the light emitting layer. According to some embodiments, in the display area, the inorganic layer may be located on the second electrode.

According to some embodiments, the display device may further include an upper insulating layer located on the second electrode. According to some embodiments, the inorganic layer may be located on the upper insulating layer.

According to some embodiments, at least one dam configured to prevent overflow of the upper insulating layer may be located in the non-display area. According to some embodiments, the dam may include the pixel defining layer and a spacer layer located on the pixel defining layer.

According to some embodiments, in the non-display area, the one side end of the inorganic layer may be located at an opposite side of the spacer layer.

According to some embodiments, the one side end of the passivation layer may be located at an opposite side of the spacer layer in the non-display area.

According to some embodiments, the one side end of the passivation layer may be located on the spacer layer and be located at an outside of the bending area in the non-display area. According to some embodiments, the passivation layer may include a second inclined surface formed corresponding to a thickness of the spacer layer.

According to some embodiments, the passivation layer may further include: a first horizontal surface connecting between the first inclined surface and the second inclined surface; and a second horizontal surface connecting the second inclined surface to the one side end of the passivation layer.

According to some embodiments, the second horizontal surface may be located while overlapping the contact hole.

According to some embodiments, at least one thin film transistor located on the substrate may be in the display area. According to some embodiments, the first metal layer may constitute a source electrode and a drain electrode of the thin film transistor.

According to some embodiments, the thin film transistor may include: a semiconductor layer including a source region electrically connected to the source electrode, a drain region electrically connected to the drain electrode, and a channel region between the source region and the drain region; and a gate electrode layer located while overlapping with the channel region, the gate electrode layer constituting a gate electrode of the thin film transistor. According to some embodiments, the gate electrode layer may be located while overlapping with the first metal layer and the contact hole in the non-display area.

According to some embodiments, the gate electrode layer may be located while overlapping with the one side end of the inorganic layer.

According to some embodiments, the display device may further include a scan driving circuit configured to output a scan signal of a high level gate voltage or a low level gate voltage to a plurality of pixels in the display area, based on a start pulse and a scan clock signal, which are input thereto. According to some embodiments, when the substrate is viewed from the front, a first contact part, a second contact part, a third contact part, and a fourth contact part are in the non-display area. According to some embodiments, the second metal layer to which the scan clock signal may be applied is located at the first contact part. According to some embodiments, the second metal layer to which the start pulse is applied may be located at the second contact part. According to some embodiments, the second metal layer to which a voltage corresponding to the high logic level is applied may be located at the third contact part. According to some embodiments, the second metal layer to which a voltage corresponding to the low logic level is applied may be located at the fourth contact part.

According to some embodiments, the one side end of the inorganic layer may be located at an outside of the first contact part.

According to some embodiments, the one side end of the inorganic layer may be located at an outside of the fourth contact part.

According to some embodiments, the one side end of the inorganic layer may be located at an outside of the third contact part.

According to some embodiments, the one side end of the inorganic layer may be located while overlapping with the second metal layer constituting the third contact part on a vertical line.

According to some embodiments, a plurality of pixels in the display area may be commonly applied with a high potential common voltage and a low potential common voltage. According to some embodiments, when the substrate is viewed from the front, a fifth contact part and a sixth contact part may be in the non-display area. According to some embodiments, the second metal layer to which the high potential common voltage is applied may be located at the fifth contact part. According to some embodiments, the second metal layer to which the low potential common voltage is applied may be located at the sixth contact part.

According to some embodiments, the one side end of the inorganic layer may be located at an outside of the sixth contact part.

According to some embodiments, the one side end of the inorganic layer may be located while overlapping with the second metal layer constituting the fifth contact part on a vertical line.

According to some embodiments, the display device may further include a first touch electrode located on a front surface of the substrate, the first touch electrode having a signal for touch sensing, which is input thereto. According to some embodiments, the inorganic layer may cover the first touch electrode.

According to some embodiments, the display device may further include an integrated circuit configured to output a signal applied to the first touch electrode, and configured to receive a signal applied from the first touch electrode to calculate a variation of capacitance.

According to some embodiments, the display device may further include a second touch electrode electrically insulated from the first touch electrode by the inorganic layer. According to some embodiments, the first touch electrode and the second touch electrode may be located in the same layer.

According to some embodiments, the display device may further include a second touch electrode electrically insulated from the first touch electrode by the inorganic layer. According to some embodiments, the first touch electrode, the inorganic layer, and the second touch electrode may be sequentially stacked.

According to some embodiments, the display device may further include an integrated circuit configured to output a signal applied to the first touch electrode, and configured to receive a signal applied from the second touch electrode to calculate a variation of capacitance formed between the first touch electrode and the second touch electrode.

According to some embodiments, the inorganic layer may be configured in a double layer structure of a first inorganic layer and a second inorganic layer.

According to some embodiments of the present disclosure, a touch display panel includes: a display panel including a substrate, a light emitting element layer in which a light emitting element is located on the substrate, and a pixel driving circuit layer in which a thin film transistor configured to drive the light emitting element is located, the display panel having a display area and a bending area, which are defined therein, wherein at least one of a plurality of pixels including the light emitting element and the pixel driving circuit is in the display area, and the bending area in which the substrate is bent toward a rear surface is included in a non-display area at the periphery of the display area; and a touch panel including a first touch electrode located at a front surface of the display panel and an inorganic layer covering the first touch electrode, wherein a contact hole located while overlapping with a connection line of the display panel, which traverses the bending area, is located in the non-display area of the display panel, and wherein the inorganic layer is located while overlapping with at least a partial area of the non-display area of the display panel, and one side end of the inorganic layer is located at an outside of the bending area and the contact hole.

According to some embodiments, the pixel driving circuit layer may include: a gate electrode layer constituting a gate electrode of the thin film transistor; a semiconductor layer including a channel region overlapping with the gate electrode, and a source region and a drain region, which are located at both sides of the channel region; a first source-drain electrode layer constituting a source electrode electrically connected to the source region of the semiconductor layer and a drain electrode electrically connected to the drain region of the semiconductor layer; a first via layer covering the first source-drain electrode layer; and a second source-drain electrode layer electrically connected to the first source-drain electrode layer in an area in which at least a portion of the first via layer is removed, and wherein the connection line is located in the same layer as at least one of the first source-drain electrode layer or the second source-drain electrode layer.

According to some embodiments, the touch panel may include the first touch electrode, the inorganic layer, and a second touch electrode insulated from the first touch electrode, which are sequentially stacked therein.

BRIEF DESCRIPTION OF THE DRAWINGS

Aspects of some embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 17 is an enlarged view of a second non-display area shown in FIG. 6.

DETAILED DESCRIPTION

Figure 1:
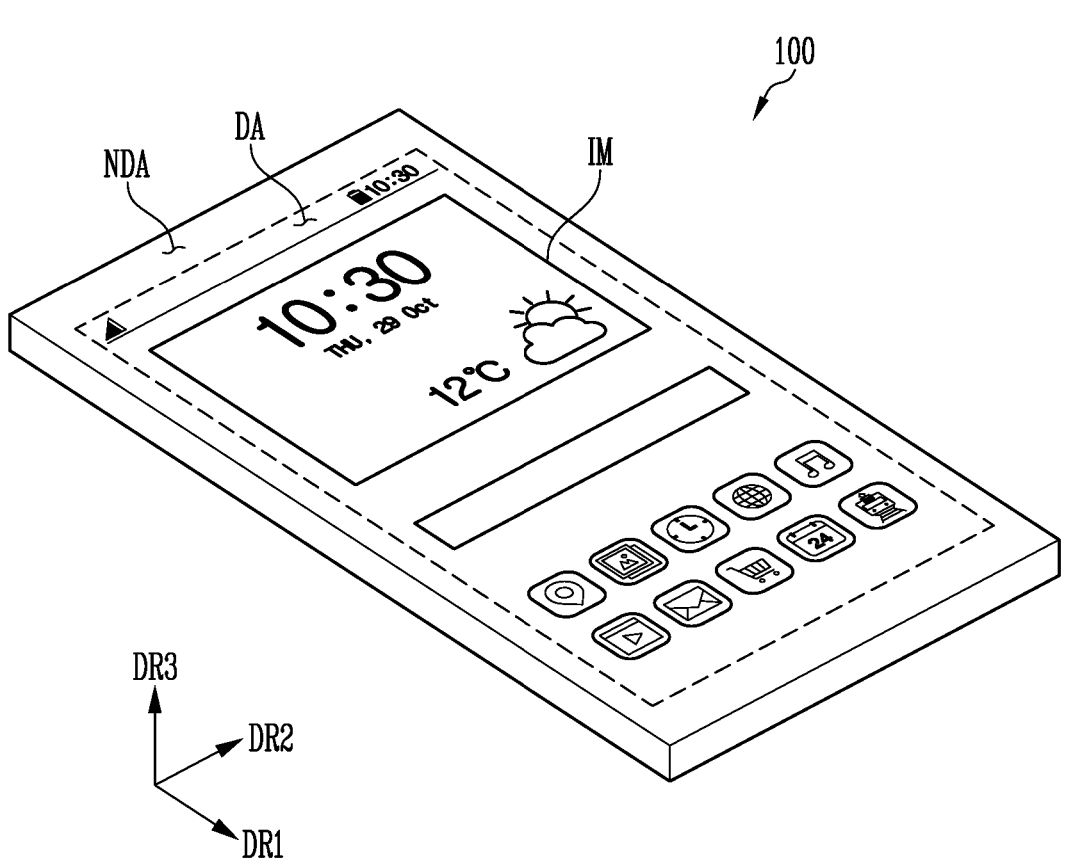
FIG. 1 is a perspective view of a display device according to some embodiments of the present disclosure.

Hereinafter, aspects of some embodiments are described in more detail with reference to the accompanying drawings so that those skilled in the art may easily practice the present disclosure. Embodiments according to the present disclosure may be implemented in various different forms and are not limited to the example embodiments described in the present specification.

A part irrelevant to the description will be omitted to clearly describe the present disclosure, and the same or similar constituent elements will be designated by the same reference numerals throughout the specification. Therefore, the same reference numerals may be used in different drawings to identify the same or similar elements.

In addition, the size and thickness of each component illustrated in the drawings are arbitrarily shown for better understanding and ease of description, but the present disclosure is not limited thereto. Thicknesses of several portions and regions are exaggerated for clear expressions.

In description, the expression "equal" may mean "substantially equal." That is, this may mean equality to a degree to which those skilled in the art can understand the equality. Other expressions may be expressions in which "substantially" is omitted.

FIG. 1 is a perspective view of a display device 100 according to some embodiments of the present disclosure.

Referring to FIG. 1, the display device 100 according to some embodiments of the present disclosure may display an image IM through a display area DA on a first surface (for example, front surface) thereof. The display area DA may be parallel to a surface defined by a first direction DR1 and a second direction DR2.

A first surface (for example, front surface (or top surface)) and a second surface (for example, rear surface (or bottom surface)) of each of members or components described hereinbelow may be distinguished from each other by a third direction DR3. However, the first direction DR1, the second direction DR2, and the third direction DR3, which are illustrated in these embodiments, are merely illustrative.

Although a planar display device is illustrated according to some embodiments of the present disclosure, embodiments according to the present disclosure are not limited thereto. For example, the display device 100 according to some embodiments of the present disclosure may include a curved display device in which at least a portion of the display area DA is curved. The display device 100 according to some embodiments of the present disclosure may include a flexible display device in which at least a portion of the display area DA is foldable or bendable. The display device 100 according to some embodiments of the present disclosure may include a stretchable display device in which at least a portion of the display area DA is stretched.

The display device 100 according to some embodiments of the present disclosure is a device for displaying a moving image or a still image, and may include portable electronic devices such as a mobile phone, a smart phone, a tablet personal computer (PC), a smart watch, a watch phone, a mobile communication terminal, an electronic notebook, an electronic book, a portable multimedia player (PMP), a navigation system, an ultra-mobile PC (UMPC). The display device 100 according to some embodiments of the present disclosure may include electronic devices such as a television, a notebook computer, a computer monitor, a digital billboard, and Internet of Things (IoT).

Referring to FIG. 1, in the display device 100 according to some embodiments of the present disclosure, a non-display area NDA may be located at the periphery of (for example, edge of) the display area DA. The non-display area NDA is an area in which the image IM is not displayed, and may be a bezel area. A driving circuit for driving a plurality of pixels located in the display area DA may be located in the non-display area NDA. The non-display area NDA may be located at the periphery of the display area DA.

Referring to FIG. 1, although the display area DA is illustrated in the shape of an angular quadrangle, the shape of the display area DA may be configured differently. For example, the display area DA may have the shape of a quadrangle of which vertices are round, have the shape of a polygon different from the quadrangle, and have the shape of a circle. The shape of the display area DA is not limited thereto, and may be variously modified and embodied.

Figure 2:
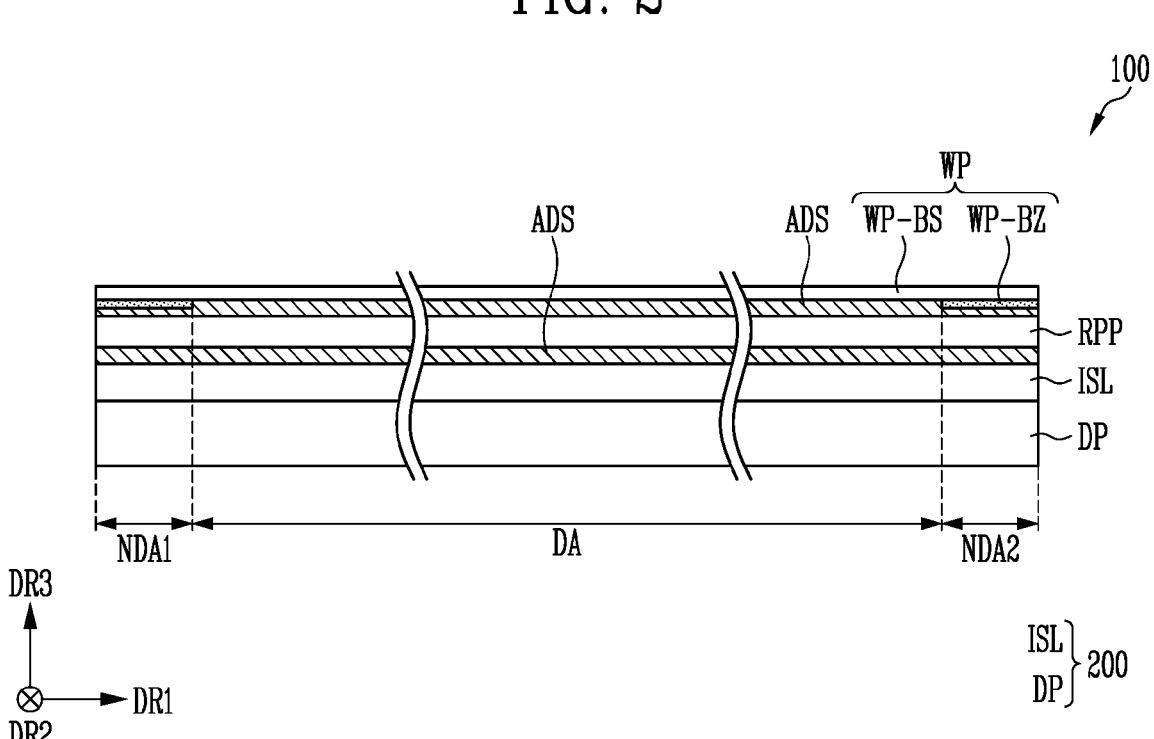
FIG. 2 is a sectional view of a display device according to some embodiments of the present disclosure.

FIG. 2 is a sectional view of a display device 100 according to some embodiments of the present disclosure.

Referring to FIG. 2, the display device 100 according to some embodiments of the present disclosure may include a display panel DP, a touch panel ISL, an anti-reflection member RPP, a window WP, and the like. At least some components among the display panel DP, the touch panel ISL, the anti-reflection member RPP, and the window WP may be formed through a continuous process, or be coupled to each other through an adhesive member. For example, the display panel DP and the touch panel ISL may be individually formed to be attached to each other. For example, at least some components constituting the touch panel ISL may be formed in a process of fabricating the display panel DP.

An adhesive member ADS may be a transparent adhesive member such as a Pressure Sensitive Adhesive (PSA), an Optically Clear Adhesive (OCA), or an Optically Clear Resin (OCR). The adhesive member described hereinbelow may include an ordinary adhesive or glue. In the display device 100 according to some embodiments of the present disclosure, the anti-reflection member RPP and the window may be replaced with other components, or be omitted according to some embodiments.

In the display device 100 according to some embodiments of the present disclosure, the display panel DP may display an image in a display area DA. The display panel DP according to some embodiments of the present disclosure may be a light emitting type display panel including a light emitting element.

A light emitting layer of the display panel DP may be an organic light emitting layer including an organic light emitting material. The light emitting layer of the display panel DP may be an inorganic light emitting layer including an inorganic light emitting material. The light emitting layer of the display panel DP may include a light emitting material such as a quantum dot or a quantum load. Hereinafter, a case where the display panel DP according to some embodiments of the present disclosure includes an organic light emitting element is described as an example, but the present is not limited thereto.

The touch panel ISL may include at least one touch electrode. A signal (hereinafter, referred to as a touch driving signal) for detecting a touch input and/or a touch coordinate may be input to the touch electrode. The touch driving signal may be of a pulse type or be a DC voltage.

A touch display panel 200 may include the display panel DP and the touch panel ISL.

The anti-reflection member RPP may decrease the reflexibility of external light incident from an upper side of the window WP. The anti-reflection member RPP according to some embodiments of the present disclosure may include a retarder, a polarizer, and the like. The retarder may be of a film type or a liquid crystal coating type. The retarder may include a $\lambda/2$ ($\lambda$ is a wavelength of light) retarder and/or a $\lambda/4$ retarder. The polarizer may be of a film type or a liquid crystal coating type. The retarder and the polarizer may further include a protection film. The retarder and the polarizer themselves or the protection film may be defined as a base layer of the anti-reflection member RPP.

The anti-reflection member RPP according to some embodiments of the present disclosure may include color filters. The color filters may have an arrangement (e.g., a set or predetermined arrangement). The arrangement of the color filters may be determined by considering light emitting colors of pixels included in the display panel DP. The anti-reflection member RPP may further include a black matrix adjacent to the color filters.

The anti-reflection member RPP according to some embodiments of the present disclosure may include a destructive interference structure. For example, the destructive interference structure may include a first reflective layer and a second reflective layer, which are located in different layers. First reflected light and second reflected light, which are respectively reflected from the first reflective layer and the second reflective layer, may be destructively interfered with each other. Accordingly, the reflexibility of external light can be decreased.

The window WP according to some embodiments of the present disclosure may include a base layer WP-BS and a light blocking pattern WP-BZ. The base layer WP-BS may include a glass substrate and/or a synthetic resin film. The base layer WP-BS is not limited to a single layer. The base layer WP-BS may include two or more films coupled to each other through an adhesive member.

The light blocking pattern WP-BZ may partially overlap with the base layer WP-BS. The light blocking pattern WP-BZ may be located at a rear surface of the base layer WP-BS. The light blocking pattern WP-BZ may substantially define a non-display area NDA of the display device 100. An area in which the light blocking pattern WP-BZ is not located may correspond to the display area DA of the display device 100. For example, the light blocking pattern WP-BZ may be located while overlapping with a second non-display area NDA2 located in the first direction DR1 as one side from the display area DA. The light blocking pattern WP-BZ may be located while overlapping with a first non-display area NDA1 located in the opposite direction of the first direction DR1 as the other side from the display area DA. When this sets limits to the window WP, the area in which the light blocking pattern WP-BZ is located may be a light blocking area of the window WP. The area in which the light blocking pattern WP-BZ is not located may be a light transmitting area of the window WP.

The light blocking pattern WP-BZ may have a multi-layer structure. The multi-layer structure may include a chromatic color layer and an achromatic (for example, black) light blocking layer. The chromatic color layer and the achromatic light blocking layer may be formed through deposition, printing, and coating processes. Although not separately shown in the drawing, the window WP may further include a functional coating layer located at a front surface of the base layer WP-BS. The functional coating layer may include anti-fingerprint layer, an anti-reflection layer, a hard coating layer, and the like.

Figure 3:
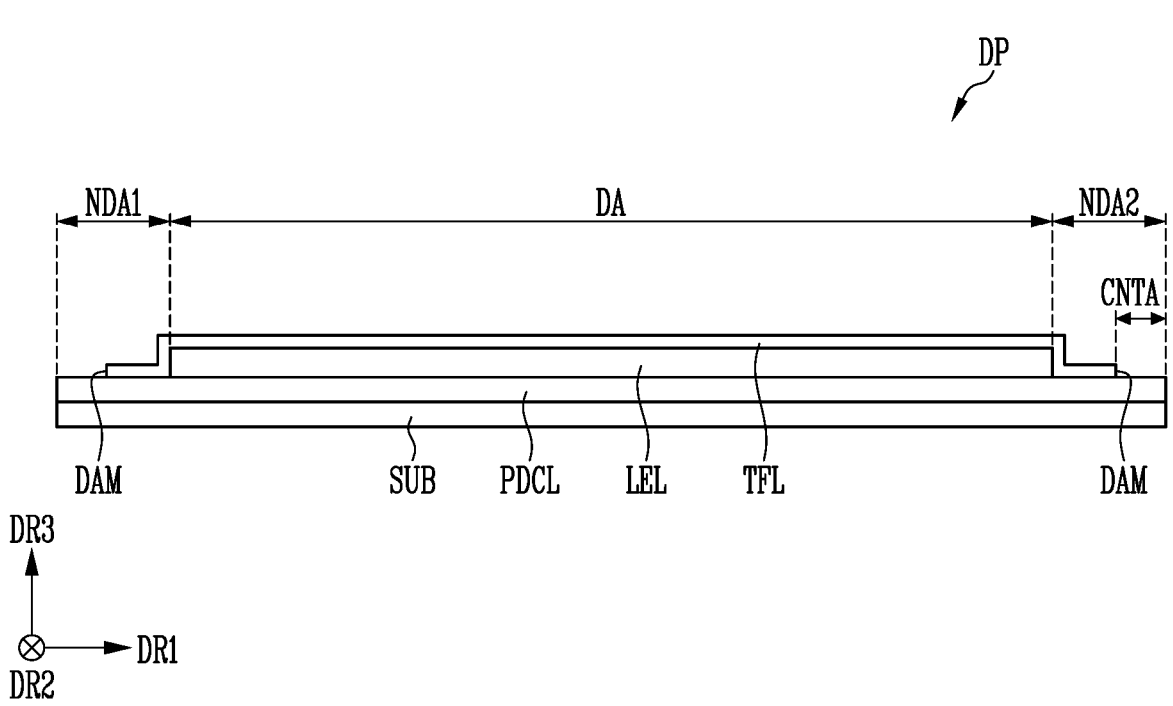
FIG. 3 is a sectional view of a display panel according to some embodiments of the present disclosure.

FIG. 3 is a sectional view of a display panel DP according to some embodiments of the present disclosure.

Referring to FIG. 3, the display panel DP according to some embodiments of the present disclosure may include a substrate SUB, a pixel driving circuit layer PDCL, a light emitting element layer LEL, an upper insulating layer TFL, and the like.

The substrate SUB may include at least one synthetic resin film. The substrate SUB may include a glass substrate, a metal substrate, and/or an organic/inorganic composite substrate.

The pixel driving circuit layer PDCL may include at least one insulating layer and a circuit element. The circuit element may include a thin film transistor (TFT), a capacitor, a signal line, and the like.

The light emitting element layer LEL may include a light emitting element. Each of a plurality of pixels located in a display area DA may include at least one light emitting element. The light emitting element layer LEL may include a pixel defining layer which defines each of the plurality of pixels.

The upper insulating layer TFL may cover the light emitting element layer LEL. The upper insulating layer TFL may include at least one encapsulation layer. The upper insulating layer TFL may include at least one inorganic encapsulation layer and at least one organic encapsulation layer. The inorganic encapsulation layer (e.g., a first inorganic encapsulation layer) may be in contact with the light emitting element layer LEL. The organic encapsulation layer may be located on the inorganic encapsulation layer. An inorganic encapsulation layer (e.g., a second inorganic encapsulation layer) may be further located on the organic encapsulation layer. The upper insulating layer TFL may perform a function of protecting an organic light emitting layer of the light emitting element layer LEL from external moisture.

A dam DAM configured to prevent overflow of the upper insulating layer TFL may be located in a non-display area NDA1 and NDA2. The dam DAM may be configured to include the pixel defining layer included in the light emitting element layer LEL. The dam DAM may be configured to further include a spacer layer located on the pixel defining layer. The dam DAM may be located in the non-display area NDA1 and NDA2 in a form surrounding the display area DA. A contact part disposition area CNTA may be located at the outside of the dam DAM.

At least one contact part may be located in the contact part disposition area CNTA. The contact part may include a contact hole, and at least two metals constituting the pixel driving circuit layer PDCL may be electrically connected to each other in the contact hole. A voltage input from the outside of the display panel DP may be transferred in the opposite direction of the first direction DR1 through the contact part.

Figure 4:
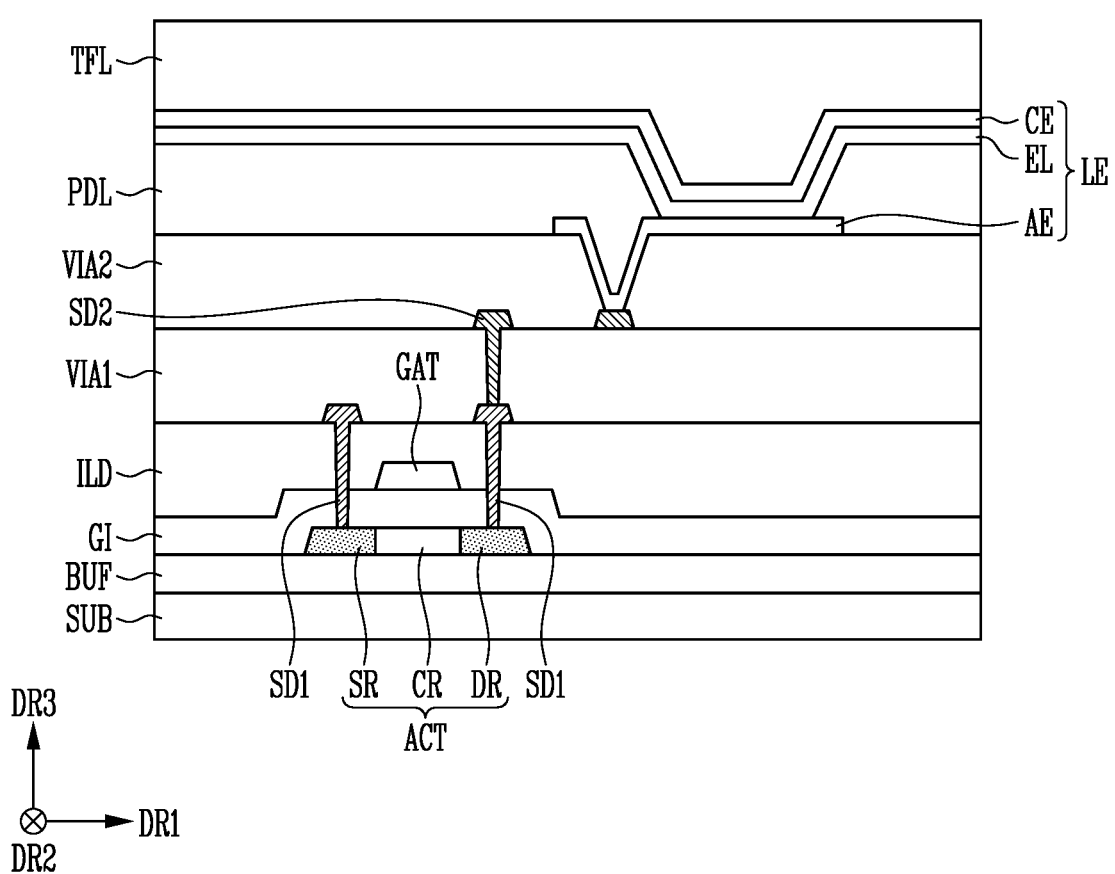
FIG. 4 is a sectional view of a display area of a display panel according to some embodiments of the present disclosure.

FIG. 4 is a sectional view of a display area of a display panel according to some embodiments of the present disclosure.

Referring to FIG. 4, the display panel may include a substrate SUB, a buffer layer BUF, a semiconductor layer ACT, a gate insulating layer GI, a gate electrode layer GAT, an interlayer insulating layer ILD, a first source-drain electrode layer SD1, a first via layer VIA1, a second source-drain electrode layer SD2, a second via layer VIA2, a first electrode layer AE, a pixel defining layer PDL, a light emitting layer EL, a second electrode layer CE, an upper insulating layer TFL, and the like.

The substrate SUB may include a glass substrate, a metal substrate, and/or an organic/inorganic composite substrate as described in FIG. 3. The substrate SUB may be a rigid substrate which is not bent. However, the substrate SUB may be a flexible substrate having flexibility.

The buffer layer BUF may be located on the substrate SUB. The buffer layer BUF may perform a moisture infiltration prevention function. By the buffer layer BUF, moisture introduced from the outside can be prevented from infiltrating into a pixel driving circuit layer. The buffer layer BUF may include at least one inorganic layer. The buffer layer BUF may be configured with at least two layers. The buffer layer BUF may include at least one of silicon nitride ($SiN_x$), silicon oxide ($SiO_x$), silicon oxynitride ($SiO_xN_y$), or aluminum oxide ($AlO_x$). According to some embodiments, the buffer layer BUF may be omitted.

The gate insulating layer GI may cover the semiconductor layer ACT. The gate insulating layer GI may include an inorganic material. The inorganic material may include at least one of silicon nitride ($SiN_x$), silicon oxide ($SiO_x$), silicon oxynitride ($SiO_xN_y$), or aluminum oxide ($AlO_x$). According to some embodiments, the gate insulating layer GI may include an organic material.

The semiconductor layer ACT may constitute a semiconductor of a thin film transistor. The semiconductor layer ACT may include at least one of a poly-silicon semiconductor, a single crystalline silicon semiconductor, an amorphous silicon semiconductor, or an oxide semiconductor.

The semiconductor layer ACT may include a channel region CR overlapping with a gate electrode layer GAT such that a channel is formed, a drain region DR located at one side of the channel region CR, and a source region SR located at the other side of the channel region CR. Each of the drain region DR and the source region SR may be a semiconductor pattern doped with an impurity. The channel region CR may be an intrinsic semiconductor pattern undoped with the impurity.

The gate electrode layer GAT may be located on the gate insulating layer GI. The gate electrode layer GAT may constitute a gate electrode of the thin film transistor. The gate insulating layer GI may be an inorganic layer.

The interlayer insulating layer ILD may cover the gate electrode layer GAT. The interlayer insulating layer ILD may be an inorganic layer including an inorganic material.

The interlayer insulating layer ILD may include at least one of silicon nitride ($SiN_x$), silicon oxide ($SiO_x$), silicon oxynitride ($SiO_xN_y$), or aluminum oxide ($AlO_x$).

The first source-drain electrode layer SD1 may constitute a source electrode and a drain electrode of the thin film transistor. The first source-drain electrode layer SD1 may be electrically connected to the source region SR of the semiconductor layer ACT to constitute the source electrode of the thin film transistor. The first source-drain electrode layer SD1 may be electrically connected to the drain region DR of the semiconductor layer ACT to constitute the drain electrode of the thin film transistor. The first source-drain electrode layer SD1 may be electrically connected to the semiconductor layer ACT in an area in which the interlayer insulating layer ILD and the gate insulating layer GI are removed.

The first via layer VIA1 may cover the first source-drain electrode layer SD1. The first via layer VIA1 may include an organic layer. The first via layer VIA1 may reduce a step difference caused by the first source-drain electrode layer SD1, thereby providing a planarization function.

The second source-drain electrode layer SD2 may be located on the first via layer VIA1. The second source-drain electrode layer SD2 may be electrically connected to the first source-drain electrode layer SD1 in an area in which at least a portion of the first via layer VIA1 is removed. The second source-drain electrode layer SD2 may be configured with the same material as the first source-drain electrode layer SD1. However, the second source-drain electrode layer SD2 may be configured with a material different from the material of the first source-drain electrode layer SD1.

The second via layer VIA2 may be located over the second source-drain electrode layer SD2. The second via layer VIA2 may include an organic layer. The second via layer VIA2 may reduce a step difference caused by the second source-drain electrode layer SD2, thereby providing a planarization function.

The buffer layer BUF, the semiconductor layer ACT, the gate insulating layer GI, the gate electrode layer GAT, the interlayer insulating layer ILD, the first source-drain electrode layer SD1, the first via layer VIA1, the second source-drain electrode layer SD2, and the second via layer VIA2 may be included in the pixel circuit driving layer PDCL described in FIG. 3.

Referring to FIG. 4, the semiconductor layer ACT, the first source-drain electrode layer SD1, and the gate electrode layer GAT may respectively constitute the semiconductor, the source electrode, and the gate electrode of the thin film transistor. According to some embodiments, the second source-drain electrode layer SD2 may constitute the source electrode and/or the drain electrode of the thin film transistor.

The first electrode layer AE may constitute a first electrode of a light emitting element LE. The first electrode may be any one of an anode electrode and a cathode electrode of the light emitting element LE. Although a case where the first electrode layer AE is the anode electrode of the light emitting element LE is assumed and described below, the present disclosure is not limited thereto. The first electrode layer AE may be electrically connected to the thin film transistor. In an example, the first electrode layer AE may be electrically connected to the second source-drain electrode layer SD2 in an area in which the second via layer VIA2 is removed.

The light emitting layer EL may include a light emitting material. In an example, the light emitting layer EL may include an organic light emitting material. The light emitting layer EL may be an organic light emitting layer. The light emitting layer EL may further include a hole injection layer, a hole transport layer, an electron transport layer, an electron injection layer, and the like, in addition to the light emitting layer actually emitting light.

The second electrode layer CE may constitute a second electrode of the light emitting element LE. The second electrode may be another of the anode electrode and the cathode electrode of the light emitting element LE. Although a case where the second electrode layer CE is the cathode electrode of the light emitting element LE is assumed and described below, the present disclosure is not limited thereto.

An emission area may be defined by the pixel defining layer PDL. The light emitting element LE may emit light in an area (also referred to as an opening) in which the pixel defining layer PDL is removed.

The upper insulating layer TFL may be located on the second electrode layer CE. The upper insulating layer TFL may have a single-layer structure or a multi-layer structure. For example, the upper insulating layer TFL may include two inorganic encapsulation layers and an organic encapsulation layer located between the two inorganic encapsulation layers.

The organic encapsulation layer may include an organic layer and provide a planarization function. The organic layer may include acrylic resin, epoxy resin, polyimide, polyethylene, silicon oxycarbon (SiOC), or the like. The organic encapsulation layer may be formed of an organic insulating material. The organic encapsulation layer may be formed through an inkjet process.

The inorganic encapsulation layer may include an inorganic insulating material with which low temperature deposition is possible. The inorganic encapsulation layer may be, for example, silicon nitride ($SiN_x$), silicon oxide ($SiO_x$), silicon oxynitride ($SiO_xN_y$), aluminum oxide ($Al_2O_3$), or the like. The inorganic encapsulation layer deposited at low temperature can prevent the light emitting layer EL from be damaged at high temperature.

Meanwhile, embodiments of a top emission manner in which light is emitted toward a front surface of the display panel (i.e., the third direction DR3) is illustrated in FIG. 4. However, according to some embodiments, embodiments of a bottom emission manner in which light is emitted toward a rear surface of the display panel (i.e., the opposite direction of the third direction DR3) may be adopted.

When embodiments of the top emission manner is adopted, the opening formed by removing at least a portion of the pixel defining layer PDL may be located while overlapping with the gate electrode GAT, the first source-drain electrode layer SD1, and the second source-drain electrode layer SD2.

When embodiments of the bottom emission manner is adopted, light may be emitted to the outside of the display panel while sequentially passing through the second via layer VIA2, the first via layer VIA1, the interlayer insulating layer ILD, the gate insulating layer GI, the buffer layer BUF, the substrate SUB, and the like. When embodiments of the bottom emission manner is adopted, the opening formed by removing at least a portion of the pixel defining layer PDL may be located while not overlapping with metal layers having high reflexibility, such as the gate electrode GAT, the first source-drain electrode layer SD1, and the second source-drain electrode SD2.

When embodiments of the bottom emission manner is adopted, unlike as shown in FIG. 4, the substrate SUB may be located in the third direction DR3 from the upper insulating layer TFL. The touch panel ISL (see FIG. 2) may be located on the substrate SUB. A distance between the touch panel ISL (see FIG. 2) and the substrate SUB may be shorter than a distance between the touch panel ISL (see FIG. 2) and the upper insulating layer TFL.

For convenience of description, a case where the embodiments of the present disclosure are applied in the top emission manner is assumed and described. However, the present disclosure may also be applied even in the bottom emission manner.

Figure 5:
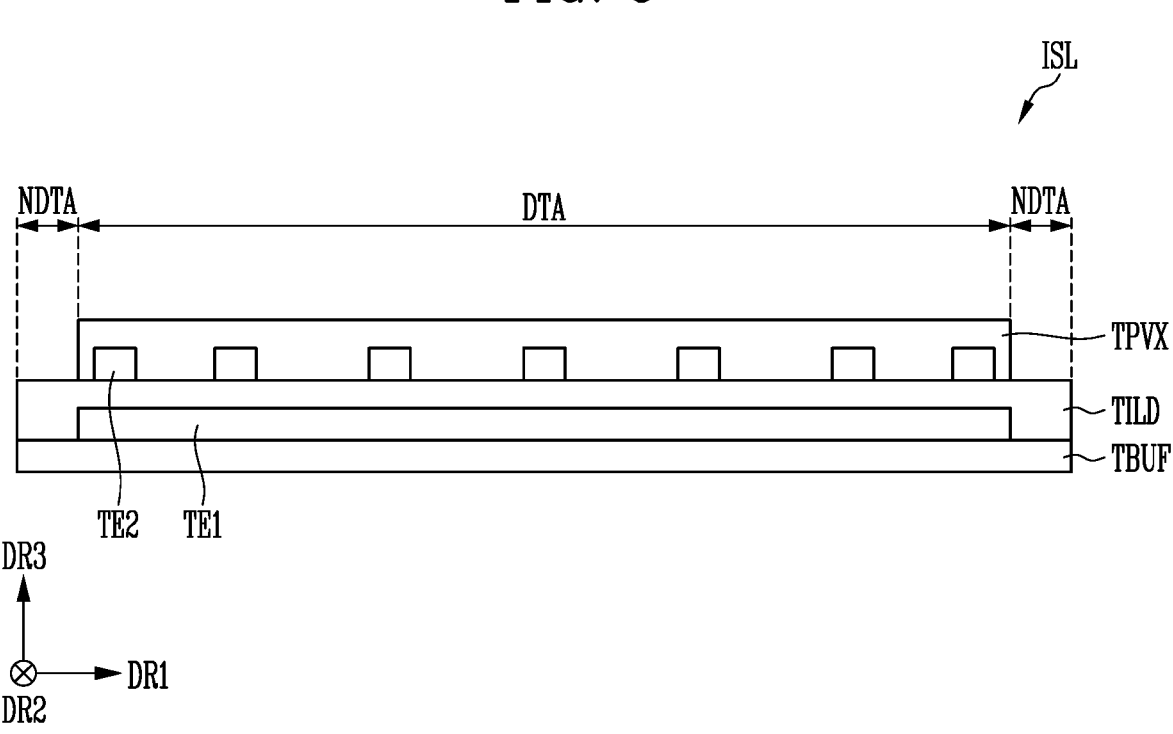
FIG. 5 is a sectional view of a touch panel according to some embodiments of the present disclosure.

FIG. 5 is a sectional view of a touch panel ISL according to some embodiments of the present disclosure.

Referring to FIG. 5, the touch panel ISL may include a touch buffer layer TBUF, a first touch electrode TE1, a touch insulating layer TILD, a second touch electrode TE2, a passivation layer TPVX, and the like.

The touch panel ISL may further include a base layer corresponding to a substrate. The touch buffer layer TBUF may further include the base layer. According to some embodiments, the base layer of the touch panel ISL may be omitted. The touch buffer layer TBUF may be located on the above-described upper insulating layer TFL (see FIG. 4). For convenience of description, a case where the touch panel ISL does not further include the base layer is described below as an example. However, the present disclosure is not limited thereto.

The touch buffer layer TBUF may be formed of an organic insulating material having a low dielectric constant. The touch buffer layer TBUF may be formed of an acrylic-based or siloxane-based material. The touch buffer layer TBUF may prevent a liquid chemical (etchant or the like) used in a process of forming the first touch electrode TE1 from being introduced into the display panel DP (see FIG. 3), and prevent external moisture from infiltrating into the display panel DP (see FIG. 3). Accordingly, a liquid chemical, moisture or the like can be prevented from being introduced into the light emitting layer EL (see FIG. 4) of the display panel DP (see FIG. 3).

The touch insulating layer TILD may be located over the first touch electrode TE1. The touch insulating layer TILD may electrically insulate the first touch electrode TE1 and the second electrode TE2, which are located in different layers, from each other. The touch insulating layer TILD may include at least one inorganic layer. For example, the touch insulating layer TILD may include a first inorganic layer and a second inorganic layer, which are configured with different materials. The touch insulating layer TILD may include at least one of materials illustrated or described as the material constituting the interlayer insulating layer ILD and the gate insulating layer GI, e.g., silicon nitride $(SiN_x)$, silicon oxide $(SiO_x)$, silicon oxynitride $(SiO_xN_y)$, or aluminum oxide $(Al_2O_3)$. According to some embodiments, the touch insulating layer TILD may include an organic material.

Each of the first touch electrode TE1 and the second touch electrode TE2 may be an electrode to which a touch driving signal is input, or be an electrode from which a touch sensing signal is sensed. A detection area DTA may be defined by an area in which the first touch electrode TE1 and the second touch electrode TE2 are located. An area in which the first touch electrode TE1 and the second touch electrode TE2 are not located in the touch panel ISL may be defined as a non-detection area NDTA. The touch buffer layer TBUF and/or the touch insulating layer TILD may be located in at least a partial area of the non-detection area NDTA.

Referring to FIG. 5, it is illustrated that the first touch electrode TE1 and the second touch electrode TE2 are not connected to each other. The first touch electrode TE1 may be a touch driving electrode to which a touch driving signal is applied. The second touch electrode TE2 may be a touch sensing electrode (or a bridge electrode of the touch sensing electrode) from which a variation of capacitance according to a touch input is sensed. On the contrary, the first touch electrode TE1 may be the touch sensing electrode, and the second touch electrode TE2 may be the touch driving electrode. A touch sensing manner in which the touch driving electrode and the touch sensing electrode are individually provided to sense a touch input may be referred to as a mutual capacitance sensing manner.

According to some embodiments, one touch electrode may perform both functions of the touch driving electrode and the touch sensing electrode. For example, a touch driving signal may be input to the first touch electrode TE1, and a variation of capacitance according to a touch input may be sensed from the first touch electrode TE1. A touch sensing manner in which one touch electrode performs both the functions of the touch driving electrode and the touch sensing electrode may be referred to as a self-capacitance sensing manner.

The embodiments of the present disclosure may be applied to both the touch sensing manner as the mutual capacitance manner and the touch sensing manner as the self-capacitance manner.

Meanwhile, referring to FIG. 5, at least a portion of the detection area DTA may overlap with the above-described display area DA. At least a portion of the non-sensing area NDTA may overlap with the above-described non-display area NDA1 and NDA2 (see FIG. 3). Accordingly, at least a portion of the touch insulating layer TILD may be arranged to overlap with the first non-display area NDA1. At least a portion of the touch insulating layer TILD may be arranged to overlap with the second non-display area NDA2.

The passivation layer TPVX may be located over the second touch electrode TE2. The passivation layer TPVX may perform a function of protecting the first touch electrode TE1 and the second touch electrode TE2. The passivation layer TPVX may include an organic insulating layer. The passivation layer TPVX may include the same material as the material constituting the above-described first via layer VIA1 and/or the above-described second via layer VIA2. The passivation layer TPVX may include a thermosetting resin.

Figure 6:
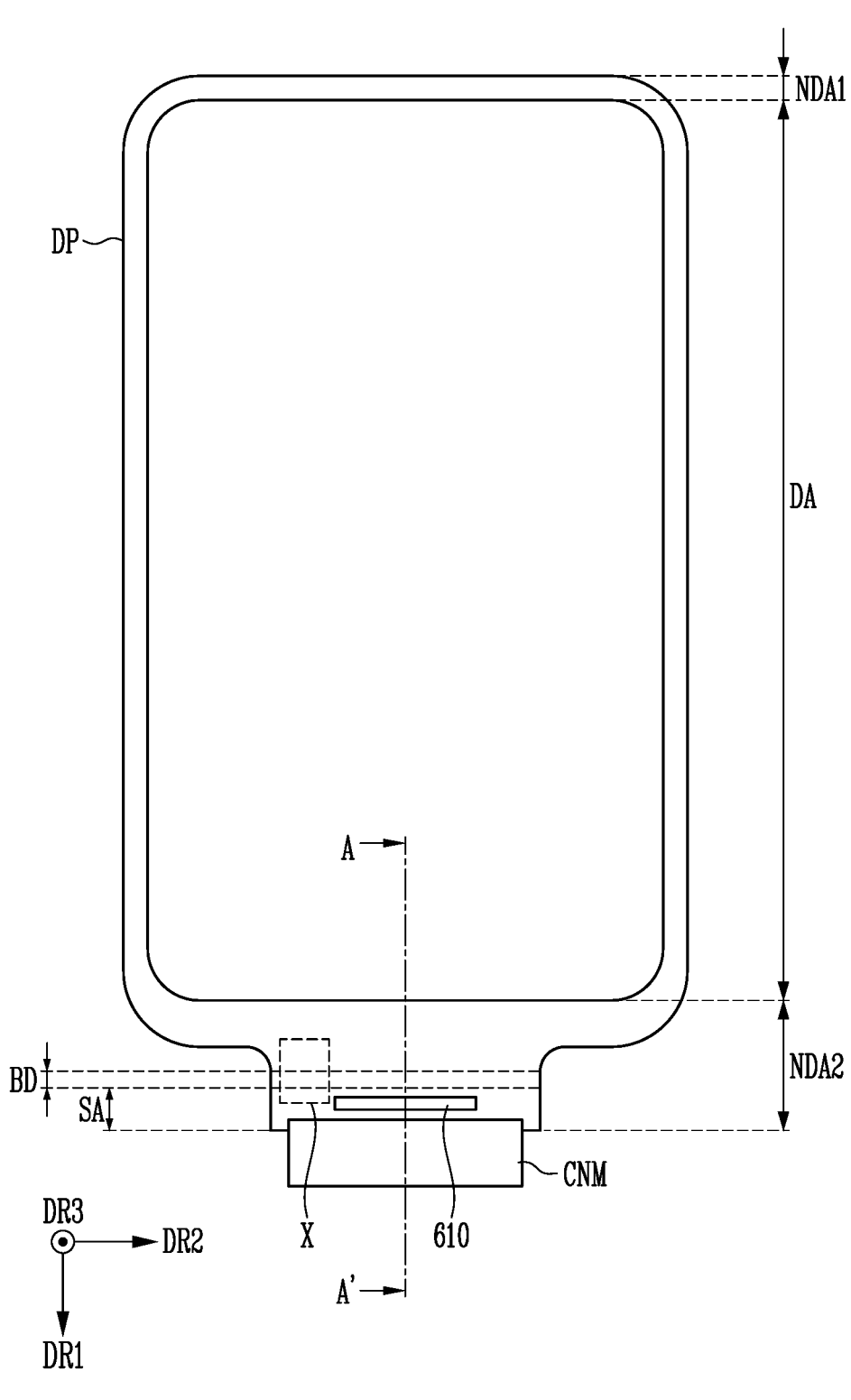
FIG. 6 is a view illustrating a display area, a non-display area, and a bending area in a display panel according to some embodiments of the present disclosure.

FIG. 6 is a view illustrating a display area DA, a non-display area NDA1 and NDA2, and a bending area BA in a display panel DP according to some embodiments of the present disclosure.

Referring to FIG. 6, a first non-display area NDA1 may be located in the opposite direction of the first direction DR1 from the display area DA, and a second non-display area NDA2 may be located in the first direction DR1 from the display area DA.

A pad part for being applied with various signals and voltages from components except the display panel DP may be located in the second non-display area NDA2. For example, a first pad part at which an integrated circuit 610 is located and a second pad part electrically connected to a connection member CNM may be located in the second non-display area NDA2. The first pad part and the second pad part may be located in a pad part disposition area SA.

The first pad part may include a connector. The first pad part may include a Flexible Flat Cable (FFC), a Flexible Printed Circuit (FPC), and the like. Like the first pad part, the second pad part may include a connector, an FFC, an FPC, and the like.

The integrated circuit 610 may include a data driving circuit capable of supplying a data voltage for image display to a plurality of pixels located in the display area DA. The integrated circuit 610 may include a touch driving circuit which supplies a touch driving signal to a touch electrode (e.g., the first touch electrode TE1 (see FIG. 5)) located while overlapping with the display area DA, and receive a touch sensing signal input from a touch electrode (e.g., the second touch electrode TE2 (see FIG. 5)). The integrated circuit 610 may include a Source Driver Integrated Circuit (SDIC), a Read-Out Integrated Circuit (ROIC), a Source driver and touch Readout Integrated Circuit (SRIC). The integrated circuit 610 may perform a function of calculating whether a touch is input, based on a variation of capacitance sensed from the touch electrode.

The connection member CNM may be configured to transfer various power sources input from the outside to the integrated circuit 610 or the display panel DP. The connection member CNM may include a Flexible Printed Circuit Board (FPCB), a Printed Circuit Board (PCB), or the like. The connection member CNM may include a Flexible Flat Cable (FPC), a Flexible Printed Circuit (FPC), and the like.

Various voltages may be input to the display panel DP through the integrated circuit 610, the connection member CNM, and the like. The voltages input to the display panel DP may be input to the plurality of pixels located in the display area DA. Alternatively, the signal and the voltages, which are input to the display panel DP, may be input to a driving circuit (e.g., a scan driving circuit and an emission driving circuit) located in the second direction DR2 or the opposite direction of the second direction DR2.

The scan driving circuit and the emission driving circuit may be referred to as driving circuits which output a signal having a turn-on logic level or a turn-off logic level so as to control emission timings of the plurality of pixels located in the display area DA. The scan driving circuit and the emission driving circuit may be directly formed in the display panel DP, and be mounted in the form of an integrated circuit on the display panel DP. Both the scan driving circuit and the emission driving circuit may be located in the same direction (e.g., the second direction DR2) from the display area DA. Any one of the scan driving circuit and the emission driving circuit may be omitted.

Referring to FIG. 6, in order to minimize the non-display area NDA1 and NDA2 viewed from a front surface of the display panel DP, at least a portion of the second non-display area NDA2 may be bent toward a read surface of the display panel DP. The second non-display area NDA2 may include a bending area BD in which the display panel DP is bent. The bending area BD may be located between the display area DA and the pad part disposition area SA.

Meanwhile, in order to transfer the voltages input to the display panel DP toward the display area DA or a driving circuit at the periphery of (for example, edge of) the display area DA, a plurality of lines traversing the bending area BD may be provided. Referring to FIG. 6, various lines as described above may be located in area X, and a line traversing the bending area BD may be electrically connected to another metal layer through a contact hole located at the periphery of the bending area BD. An area in which the contact hole at the periphery of the bending area BD is located will be described below with reference to FIG. 7.

Figure 7:
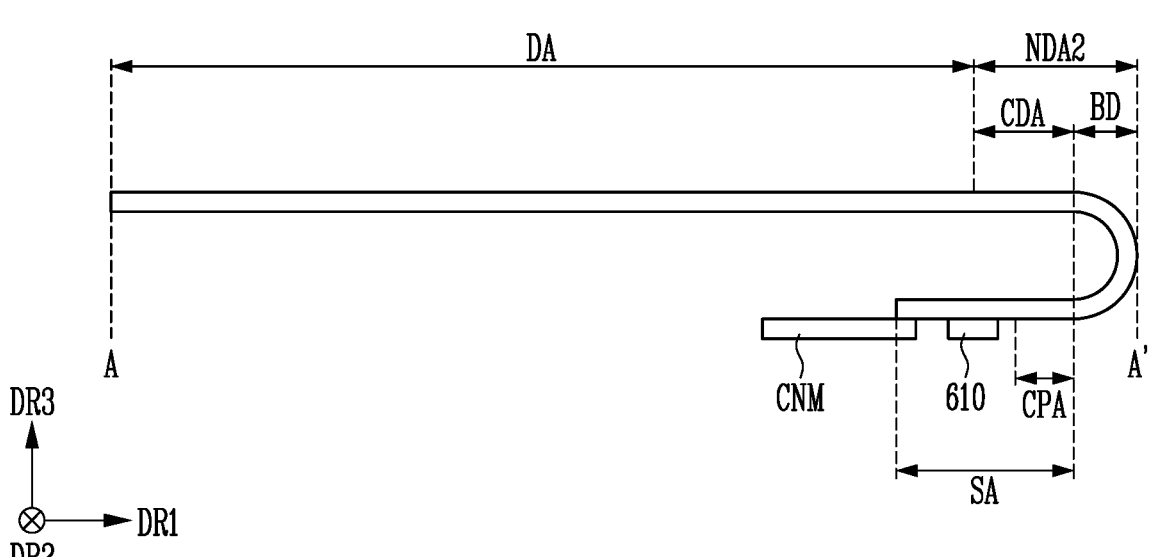
FIG. 7 is a sectional view taken along line A-A' shown in FIG. 6 in a state in which the display panel is bent in the bending area according to some embodiments of the present disclosure.

FIG. 7 is a sectional view taken along line A-A' shown in FIG. 6 in a state in which the display panel is bent in the bending area BD according to some embodiments of the present disclosure.

A contact hole for electrically connecting a line traversing the bending area BD to another metal layer may be located at the periphery of (for example, edge of) the bending area BD. The corresponding contact hole may be located between the bending area BD and the display area DA and between the bending area BD and the integrated circuit 610.

Referring to FIG. 7, an area in which the contact hole is located between the bending area BD and the display area DA may be defined as a display area side contact hole disposition area CDA. An area in which the contact hole is located between the bending area BD and the integrated circuit 610 may be defined as a pad part side contact hole disposition area CPA.

Figure 8:
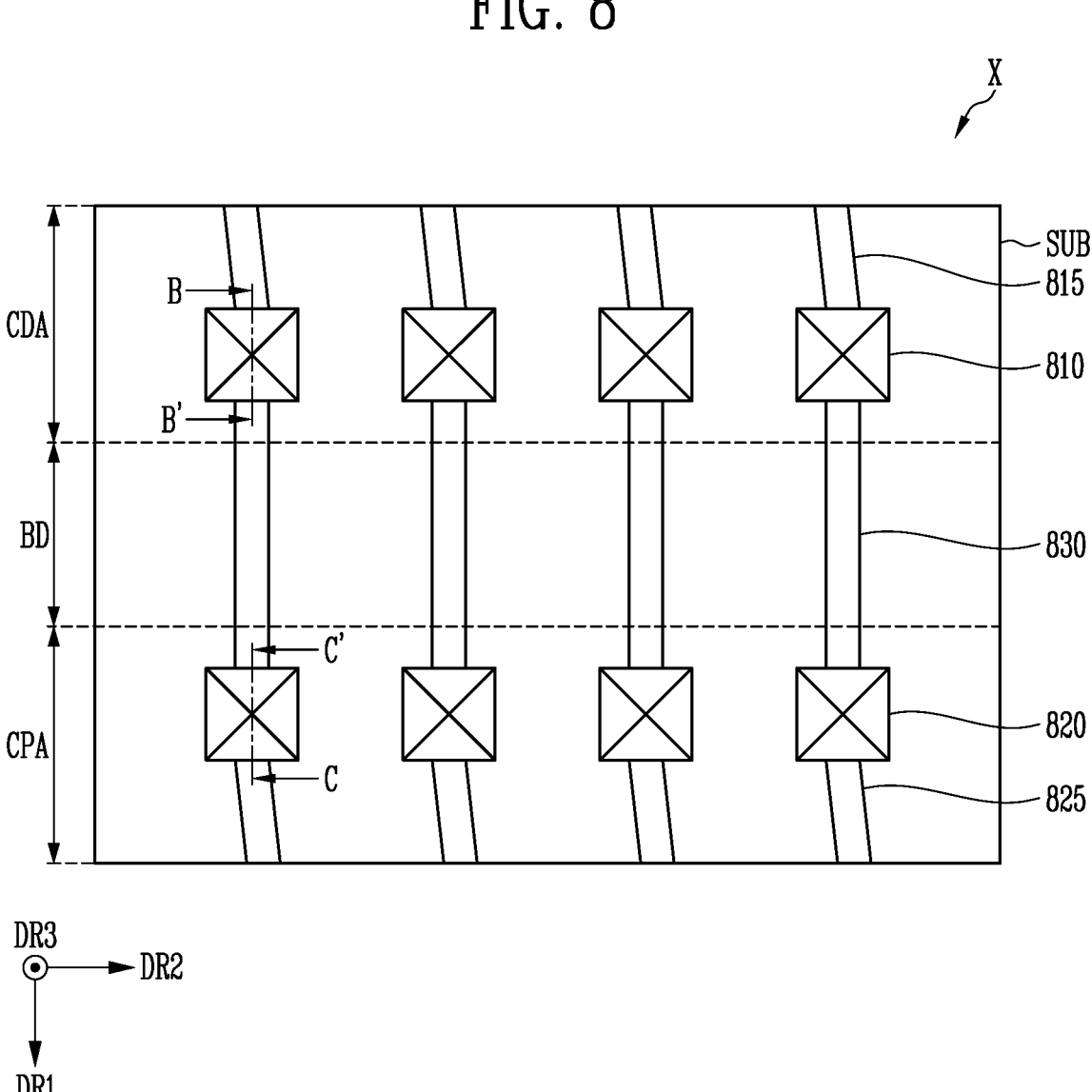
FIG. 8 is an enlarged view illustrating in more detail the area X shown in FIG. 6.

FIG. 8 is an enlarged view illustrating in detail the area X shown in FIG. 6.

Referring to FIG. 8, each of the display area side contact hole disposition area CDA, the bending area BD, and the pad part side contact hole disposition area CPA is illustrated.

A display area side contact part 810 and a display area side link line 815 may be located in the display area side contact hole disposition area CDA. A pad part side contact part 820 and a pad part side link line 825 may be located in the pad part side contact hole disposition area CPA. The display area side contact part 810 and the pad part side contact part 820 may be electrically connected to each other through a connection line 830.

Each of the display area side contact part 810 and the pad part side contact part 820 may include at least one contact hole. At least one of the display area side contact part 810 and at least one of the pad part side contact part 820 may be defined as an area in which a contact hole located while overlapping with the connection line 830 is located when the substrate SUB is viewed from the front.

The display area side link line 815 may be a line configured to transfer a voltage transferred from the connection line 830 toward the display area DA (see FIG. 6) or toward the above-described scan driving circuit and/or the above-described emission driving circuit.

The pad part side link line 825 may be a line configured to transfer a voltage applied from the integrated circuit 610 (see FIG. 6) and/or the connection member CNM (see FIG. 6) toward the connection line 830.

The connection line 830 may be located while traversing the bending area BD. The connection line 830 may be arranged to extend in the first direction DR1. The first direction DR1 is perpendicular to the second direction DR2 in which the bending area BD extends. The connection line 830 may include a metal layer different from a metal layer constituting the display area side link line 815 and the pad part side link line 825.

Meanwhile, referring to FIG. 8, the bending area BD is an area in which the substrate SUB is substantially bent, and hence a stress acts on layers on the substrate SUB. In particular, a larger stress may act on a layer located distant from the substrate SUB. Therefore, an inorganic layer may be removed on the connection line 830.

Figure 9:
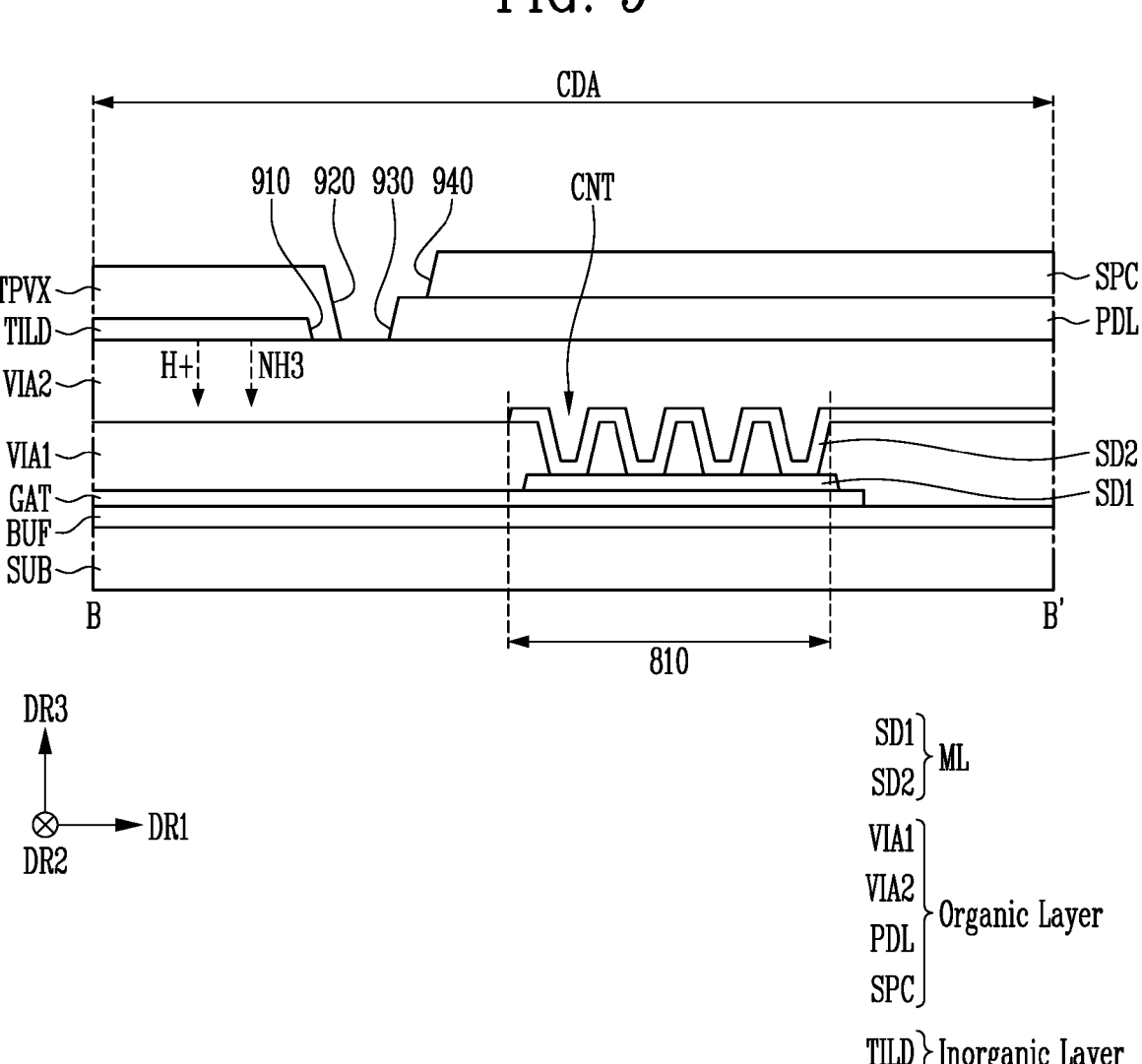
FIG. 9 is a sectional view of the display device taken along line B-B' shown in FIG. 8 according to some embodiments of the present disclosure.

FIG. 9 is a sectional view of the display device taken along line B-B' shown in FIG. 8 according to some embodiments of the present disclosure.

FIG. 9 illustrates a sectional view of the display area side contact hole disposition area CDA in the display device according to some embodiments of the present disclosure.

Referring to FIG. 9, at least one contact hole CNT is located at the display area side contact part 810. The first via layer VIA1 may include the contact hole CNT. Although a case where four contact holes CNT are located at the display area side contact part 810 is illustrated, the number of contact holes CNT may be smaller than or greater than 4.

Referring to FIG. 9, although a case where the four contact holes CNT are arranged side by side in the first direction DR1 is illustrated, a plurality of contact holes CNT may be arranged differently therefrom according to a design. For example, the plurality of contact holes CNT may be arranged side by side in the second direction DR2, and be arranged side by side in the first direction DR1 and the second direction DR2. According to some embodiments, the plurality of contact holes CNT may be arranged side by side in a direction obtained by synthesizing a vector of the first direction DR1 and a vector of the second direction DR2. According to some embodiments, the plurality of contact holes CNT may be irregularly arranged.

At the display area side contact part 810, the contact hole CNT may be formed as the first via layer VIA1 is removed, and the gate electrode layer GAT, the first source-drain electrode layer SD1, and the second source-drain electrode layer SD2 may be sequentially located in the contact hole CNT.

The second source-drain electrode layer SD2 may correspond to the connection line 830 (see FIG. 8). The gate electrode layer GAT may correspond to the display area side link line 815 (see FIG. 8).

Meanwhile, the inorganic layer (e.g., the touch insulating layer TILD) may not be located on the contact hole CNT of the display area side contact part 810. More specifically, the inorganic layer may be located on the first source-drain electrode layer SD1 and the second source-drain electrode layer SD2 while not overlapping with the first source-drain electrode layer SD1 and the second source-drain electrode layer SD2 at the display area side contact part 810.

The inorganic layer may be referred to as the above-described touch insulating layer TILD. Alternatively, the inorganic layer may be referred to as another inorganic layer different from the touch insulating layer TILD. According to some embodiments, the inorganic layer is not the inorganic layer included in the touch panel ISL (see FIG. 5), but may be the inorganic layer included in the display panel DP (see FIG. 3).

Hereinafter, for convenience of description, a case where the inorganic layer located on the first source-drain electrode layer SD1 and the second source-drain electrode layer SD2 is the touch insulating layer TILD has been described as an example. However, the inorganic layer discussed below is not limited to only the touch insulating layer TILD.

Referring to FIG. 9, the touch insulating layer TILD may extend toward one side, and the one side may be the first direction DR1.

Meanwhile, the inorganic layer may be oxidized in a high-temperature, high-humidity environment. When the inorganic layer is oxidized in the high-temperature, high-humidity environment, a hydrogen ion (H+) and ammonia gas (NH3) (or ammonium ion (NH4+)) may be generated. The hydrogen ion (H+) and/or the ammonia gas (NH3), which are generated as the touch insulating layer TILD is oxidized, may be diffused into a lower layer.

Referring to FIG. 9, when the contact hole CNT is located while overlapping with the touch insulating layer TILD, the generated hydrogen ion (H+) may oxidize the first source-drain electrode layer SD1 and the second source-drain electrode layer SD2. When the first source-drain electrode layer SD1 and the second source-drain electrode layer SD2 are oxidized, a bonding force between metal layers ML becomes weak, and therefore, a phenomenon may occur, in which contact between the metal layers ML becomes faulty.

The metal layer ML may include the first source-drain electrode layer SD1 and the second source-drain electrode layer SD2. The first source-drain electrode layer SD1 may be a first metal layer. The second source-drain electrode layer SD2 may be a second metal layer.

When the contact hole CNT is located while overlapping with the touch insulating layer TILD, the generated ammonia gas (NH3) may be concentrated on an area in which the first via layer VIA1 is removed. As the ammonia gas (NH3) is diffused into the area in which a step difference occurs due to the removal of the first via layer VIA1, a phenomenon may occur, in which the first via layer VIA1 and/or the second via layer VIA2 come/comes off. Accordingly, a phenomenon may occur, in which the contact between the metal layers ML becomes faulty as the bonding force between the first source-drain electrode layer SD1 and the second source-drain electrode layer SD2 becomes weak.

The contact failure between the first source-drain electrode layer SD1 and the second source-drain electrode layer SD2 may cause deterioration of display quality.

Therefore, in the display device according to some embodiments of the present disclosure, one side end 910 of the inorganic layer (e.g., the touch insulating layer TILD) may be located at an outside of the contact hole CNT (i.e., the opposite direction of the first direction DR1).

The one side end 910 of the touch insulating layer TILD may be located at an opposite side of the pixel defining layer PDL. The other side (i.e., the opposite direction of the first direction DR1) end 930 of the pixel defining layer PDL may be located at an opposite side of the one side end of the touch insulating layer TILD.

The one side end 910 of the touch insulating layer TILD may be located at an opposite side of a spacer layer SPC. The other side end 940 of the spacer layer SPC may be located at an opposite side of the one side end 910 of the touch insulating layer TILD.

Referring to FIG. 9, the pixel defining layer PDL as an organic layer may be located while overlapping with the contact hole CNT. The spacer layer SPC as an organic layer may be located while overlapping with the contact hole CNT.

Referring to FIG. 9, the passivation layer TPVX may be located while covering the touch insulating layer TILD. One side end 920 of the passivation layer TPVX may be located inwardly (i.e., the first direction DR1) of the one side end 910 of the touch insulating layer TILD. The one side end 920 of the passivation layer TPVX may be located between the one side end 910 of the touch insulating layer TILD and the other side end 930 of the pixel defining layer PDL. The one side end 920 of the passivation layer TPVX may be located between the one side end 910 of the touch insulating layer TILD and the other side end 940 of the spacer layer SPC.

According to some embodiments of the present disclosure, the phenomenon is reduced, in which the bonding force between the first source-drain electrode layer SD1 and the second source-drain electrode layer SD2 becomes weak, thereby minimizing a failure of the display device.

Figure 10:
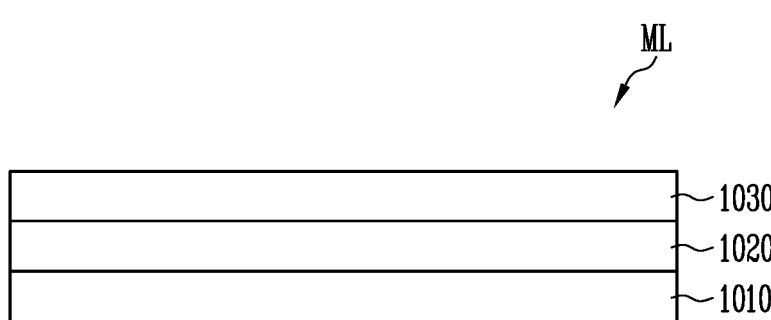
FIG. 10 is a view briefly illustrating a triple layer structure of a metal layer according to some embodiments of the present disclosure.

FIG. 10 is a view briefly illustrating a triple layer structure of a metal layer ML according to some embodiments of the present disclosure.

Referring to FIG. 10, the metal layer ML according to some embodiments of the present disclosure may have a triple layer structure. The metal layer ML may include the above-described first source-drain electrode layer SD1 (see FIG. 9) and the above-described second source-drain electrode layer SD2 (see FIG. 9).

A first layer 1010 and a third layer 1030 may include titanium (Ti). A second layer 1020 may include aluminum (Al). This triple layer structure is referred to as a Ti/Al/Ti structure.

According to a design of the metal layer ML, the material included in each of the first layer 1010, the second layer 1020, and the third layer 1030 may be different therefrom.

The material constituting the first layer 1010 and the third layer 1030 may be oxidized while being bonded to a hydrogen ion. When the first layer 1010 and the third layer 1030 are oxidized, a bonding force of the first layer 1010 and the third layer 1030 with another metal layer ML and a bonding force of the first layer 1010 and the third layer 1030 with the second layer 1020 may become weak. For example, when titanium (Ti) is oxidized by the hydrogen ion, the bonding force of the first layer 1010 and the third layer 1030 may become weak on an oxidized surface.

The second layer 1020 may be oxidized while being bonded to the hydrogen ion. When the material constituting the second layer 1020 is oxidized by the hydrogen ion, hydrogen gas (i.e., H2 gas) may be generated from a surface of the second layer 1020. For example, when aluminum (Al) is oxidized by the hydrogen ion, the hydrogen gas may be generated from the surface of the second layer 1020. Therefore, a gap may occur between the second layer 1020 and the first layer 1010, and a gap may occur between the second layer 1020 and the third layer 1030. When the hydrogen ion infiltrates into the gap occurring due to the oxidization of the second layer 1020, the oxidization of the first layer 1010 and the third layer 1030 may be further accelerated. Accordingly, the oxidization of the metal layer ML may rapidly progress.

In the embodiments of the present disclosure, the distance between an area in which the hydrogen ion is generated and an area in which the metal layer ML is located can be lengthened, and the speed at which the metal layer ML is oxidized can be reduced.

FIGS. 11 to 15 are sectional views of the display device taken along the line B-B' shown in FIG. 8 according to some embodiments of the present disclosure.

Figure 11:
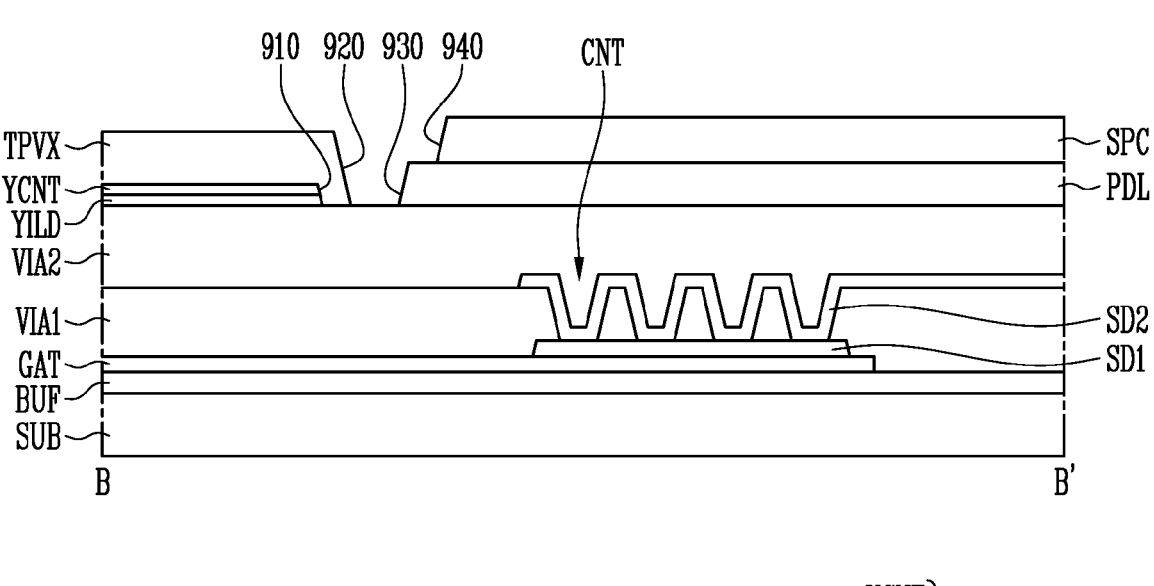
FIGS. 11 to 15 are sectional views of the display device taken along the line B-B' shown in FIG. 8 according to some embodiments of the present disclosure.

Referring to FIG. 11, in the display device according to some embodiments of the present disclosure, an inorganic layer having a double layer structure may be included.

The inorganic layer according to some embodiments of the present disclosure may include a first inorganic layer YILD and a second inorganic layer YCNT. The first inorganic layer YILD and the second inorganic layer YCNT may constitute the touch insulating layer TILD. One side end of the first inorganic layer YILD and one side end of the second inorganic layer YCNT may be continued without any step difference. The one side end of the first inorganic layer YILD and the one side end of the second inorganic layer YCNT may correspond to one side end of the touch insulating layer TILD.

Descriptions of the other components are the same as described above, and therefore will be omitted.

Figure 12:
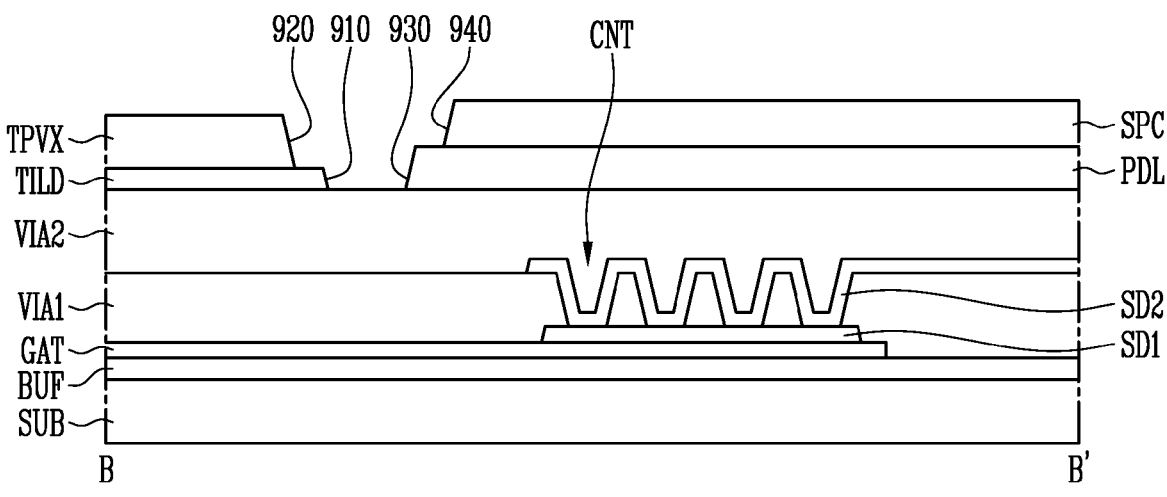

Referring to FIG. 12, in the display device according to some embodiments of the present disclosure, the one side end 910 of the touch insulating layer TILD is not covered by the passivation layer TPVX but may be exposed. The one side end 910 of the touch insulating layer TILD may be located inwardly of the one side end 920 of the passivation layer TPVX.

Descriptions of the other components are the same as described above, and therefore will be omitted.

Figure 13:
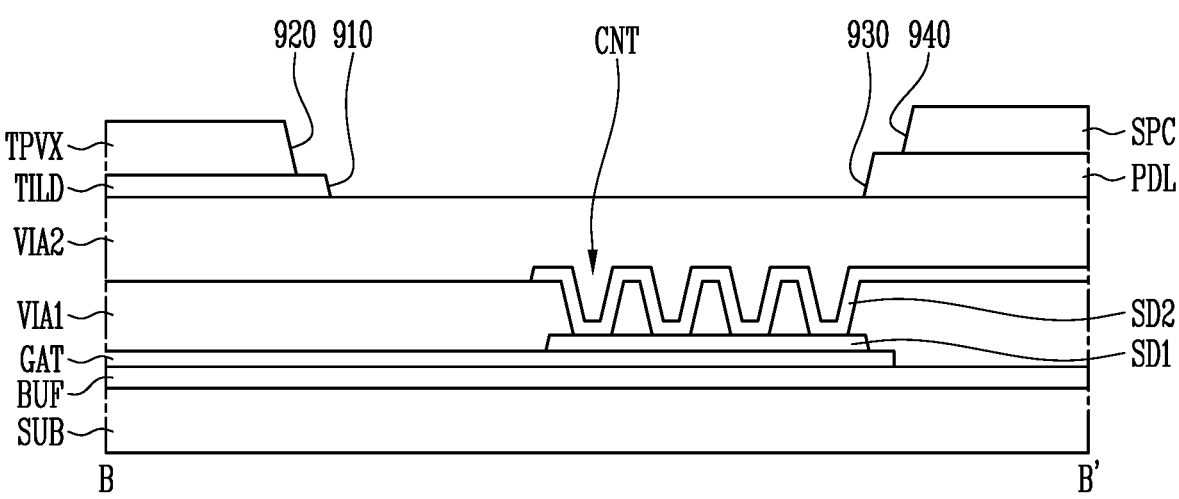

Referring to FIG. 13, in the display device according to some embodiments of the present disclosure, the pixel defining layer PDL and/or the spacer layer SPC may be located inwardly of the contact hole CNT. The pixel defining layer PDL and/or the spacer layer SPC may be located while not overlap with the contact hole CNT.

The other side end 930 of the pixel defining layer PDL may be located inwardly of the contact hole CNT. The other side end 940 of the spacer layer SPC may be located inwardly of the contact hole CNT.

Descriptions of the other components are the same as described above, and therefore will be omitted.

Figure 14:
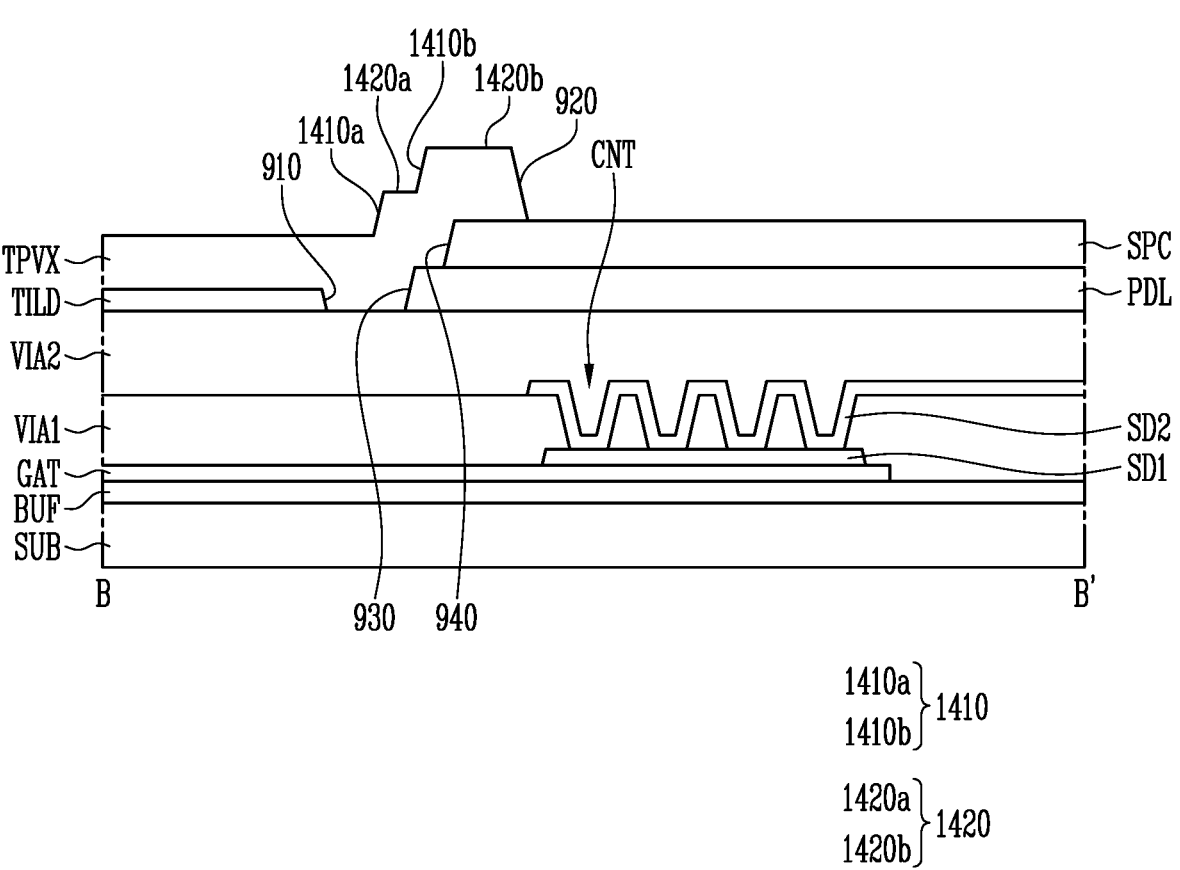

Referring to FIG. 14, at least a portion of the passivation layer TPVX may be located on the pixel defining layer PDL and/or the spacer layer SPC.

The one side end 920 of the passivation layer TPVX may be located inwardly of the other side end 930 of the pixel defining layer PDL. The one side end 920 of the passivation layer TPVX may be located inwardly of the other side end 940 of the spacer layer SPC.

The passivation layer TPVX may be located while not overlapping with the contact hole CNT. The one side end 920 of the passivation layer TPVX may be located at an outside of the contact hole CNT.

Referring to FIG. 14, the passivation layer TPVX may include an inclined surface 1410 and a horizontal surface 1420 continued from the inclined surface 1410.

The passivation layer TPVX may include a first inclined surface 1410*a* formed corresponding to the thickness of the pixel defining layer PDL. The passivation layer TPVX may include a second inclined surface 1410*b* formed corresponding to the thickness of the spacer layer SPC.

The passivation layer TPVX may include a first horizontal surface 1420*a* connecting between the first inclined surface 1410*a* and the second inclined surface 1410*b*. The first horizontal surface 1420*a* may be parallel to a top surface of the pixel defining layer PDL.

The passivation layer TPVX may include a second horizontal surface 1420*b* connecting between the second inclined surface 1410*b* and the one side end 920 of the passivation layer TPVX. The second horizontal surface 1420*b* may be parallel to a top surface of the spacer layer SPC.

The passivation layer TPVX may fill an area between the one side end 910 of the touch insulating layer TILD and the pixel defining layer PDL.

Descriptions of the other components are the same as described above, and therefore will be omitted.

Figure 15:
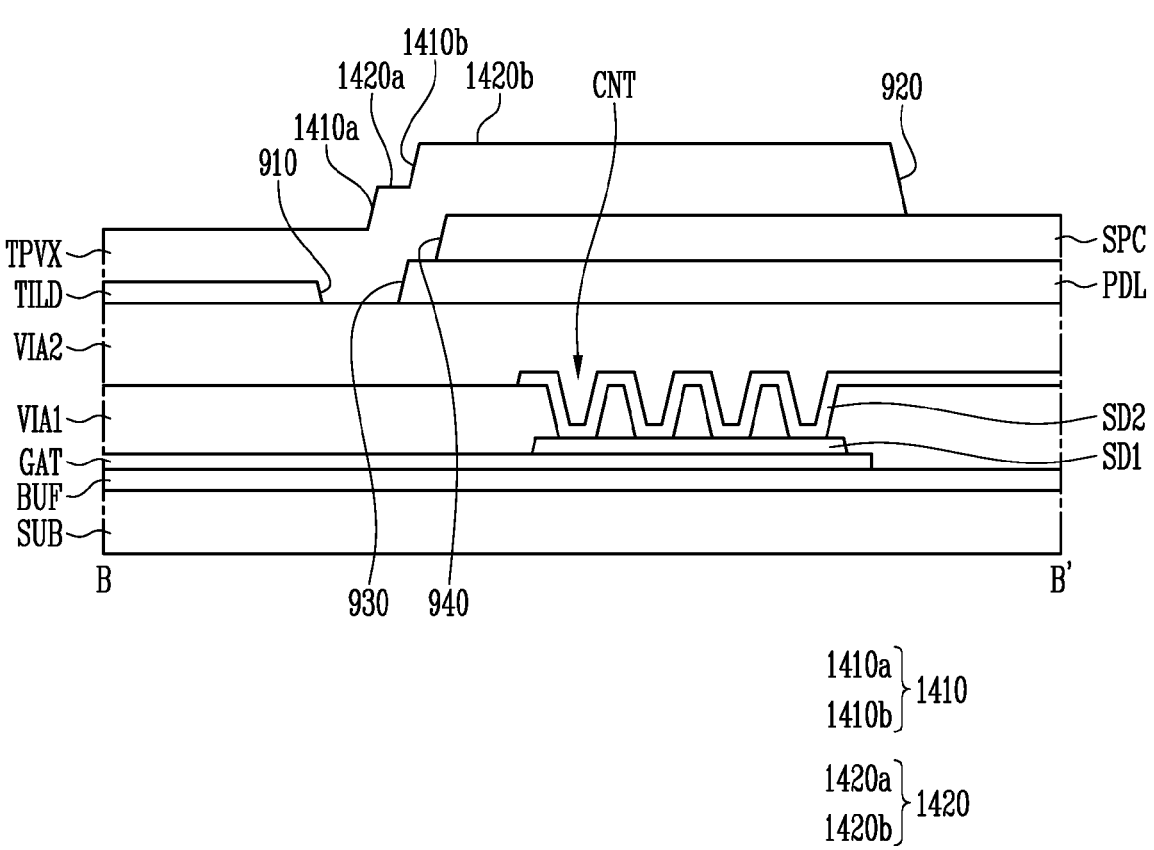

Referring to FIG. 15, in the display device according to some embodiments of the present disclosure, the passivation layer TPVX may be located while overlapping with the contact hole CNT. The one side end 920 of the passivation layer TPVX may be located inwardly of the contact hole CNT.

Descriptions of the other components are the same as described above, and therefore will be omitted.

Figure 16:
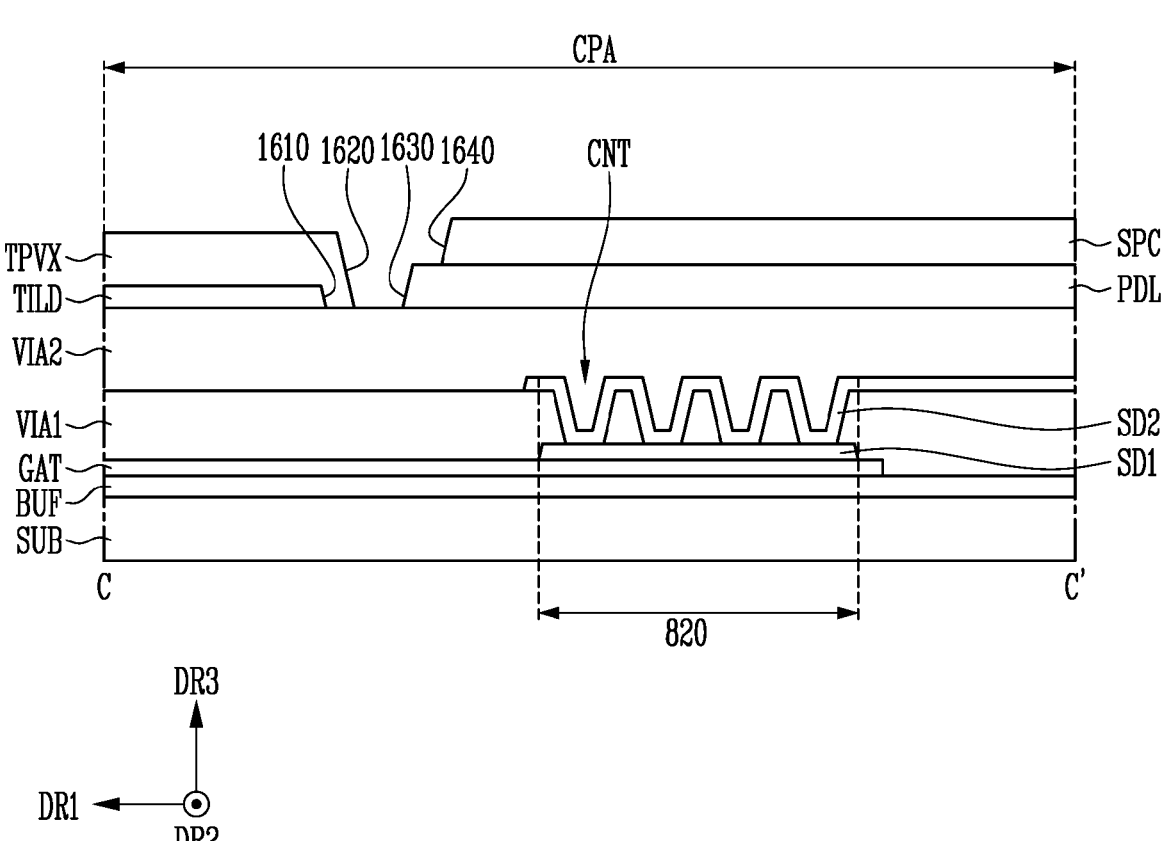
FIG. 16 is a sectional view of the display device taken along line C-C' shown in FIG. 8 according to some embodiments of the present disclosure.

FIG. 16 is a sectional view of the display device taken along line C-C' shown in FIG. 8 according to some embodiments of the present disclosure.

FIG. 16 illustrates a sectional view of the pad part side contact hole disposition area CPA in the display device according to some embodiments of the present disclosure.

The pad part side contact part 820 may include at least one contact hole CNT. The pad part side contact part 820 may be configured identically to the above-described display area side contact part 810 (see FIG. 9). However, the pad part side contact part 820 may be configured differently from the above-described display area side contact part 810 (see FIG. 9).

Referring to FIG. 16, the second source-drain electrode layer SD2 may correspond to the connection line 830 (see FIG. 8), and the gate electrode layer GAT may correspond to the pad part side link line 825 (see FIG. 8).

The inorganic layer may extend to the other side (i.e., the opposite direction of the first direction DR1) in the pad part side contact hole disposition area CPA. For example, the touch insulating layer TILD may extend toward the other side in the pad part side contact hole disposition area CPA.

The other side end 1610 of the touch insulating layer TILD may be located at an opposite side of the pixel defining layer PDL. The other side end 1610 of the touch insulating layer TILD may be located at an opposite side of one side (i.e., the first direction DR1) end 1630 of the pixel defining layer PDL.

The other side end 1610 of the touch insulating layer TILD may be located at an opposite side of one side end 1640 of the spacer layer SPC.

The other side end 1620 of the passivation layer TPVX may be located inwardly (i.e., the opposite direction of the first direction DR1) of the other side end 1610 of the touch insulating layer TILD. However, the position of the other side end 1620 of the passivation layer TPVX is not limited thereto, and the embodiments of the position of the one side end 920 of the passivation layer TPVX, which are described with reference to FIGS. 12 to 15, may be applied as they are.

The one side end 1630 of the pixel defining layer PDL may be located at an outside (i.e., the first direction DR1) of the contact hole CNT. However, the position of the one side end 1630 of the pixel defining layer PDL is not limited thereto, and the embodiments of the other side end 930 of the pixel defining layer PDL, which are described above in FIG. 13, may be applied as it is.

The one side end 1640 of the spacer layer SPC may be located at an outside (i.e., the first direction DR1) of the contact hole CNT. However, the position of the one side end 1640 of the spacer layer SPC is not limited thereto, and the embodiments of the other side end 940 of the spacer layer SPC, which are described above in FIG. 13, may be applied as it is.

Accordingly, the inorganic layer may not be located on the pad part side contact part 820. At the pad part side contact part 820, the other side end 1610 of the touch insulating layer TILD may be located at an outside of the contact hole CNT. Accordingly, the oxidization of the first source-drain electrode SD1 and the second source-drain electrode SD2 is delayed, and thus a problem that a contact in the contact hole CNT becomes faulty can be prevented.

Figure 17:
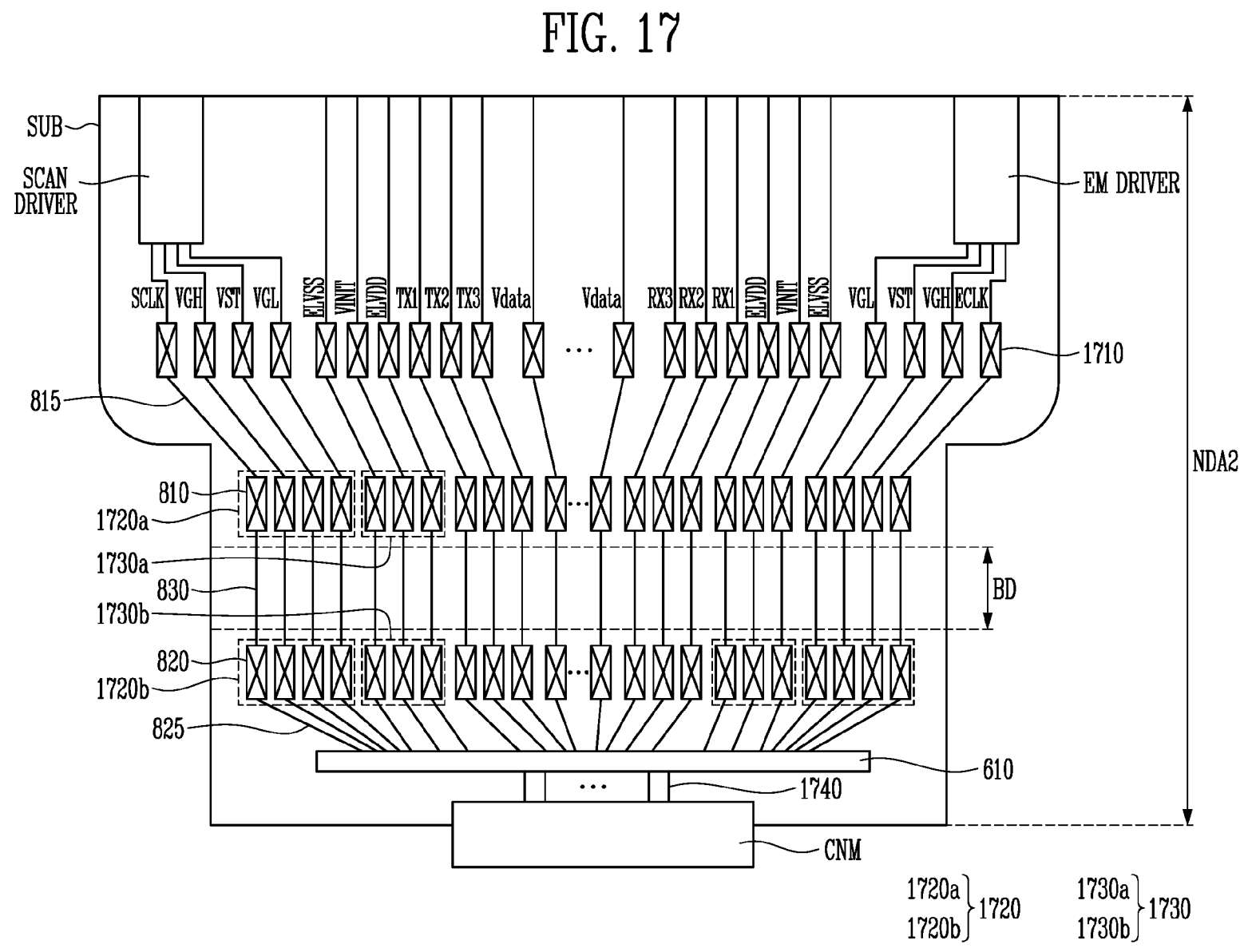

FIG. 17 is an enlarged view of the second non-display area NDA2 shown in FIG. 6.

Voltages applied to the substrate SUB through the connection member CNM, voltages applied to the substrate SUB through the integrated circuit 610, and voltages input in a direction from the substrate SUB to the integrated circuit 610 are illustrated in FIG. 17.

The integrated circuit 610 may be electrically connected to the connection member CNM through a line 1740 located on the substrate SUB.

According to some embodiments, the voltages may include a scan clock signal SCLK, a high level gate voltage VGH, a low level gate voltage VGL, a start pulse VST, and the like, which are input to a scan driving circuit SCAN DRIVER.

The scan driving circuit SCAN DRIVER may output a scan signal of the high level gate voltage VGH or the low level gate voltage VGL to the plurality of pixels located in the display area, based on the start pulse VST and the scan clock signal SCLK, which are input thereto.

The high level gate voltage VGH may have any one of a turn-on logic level and a turn-off logic level. The low level gate voltage VGL may have the other of the turn-on logic level and the turn-off logic level.

According to some embodiments, the voltages may include an emission clock signal ECLK, a high level gate voltage VGH, a low level gate voltage VGL, a start pulse VST, and the like, which are input to an emission driving circuit EM DRIVER.

The emission driving circuit EM DRIVER may output an emission signal of the high level gate voltage VGH or the low level gate voltage VGL to the plurality of pixels located in the display area, based on the start pulse VST and the emission clock signal ECLK, which are input thereto.

The high level gate voltage VGH may have any one of a turn-on logic level and a turn-off logic level. The low level gate voltage VGL may have the other of the turn-on logic level and the turn-off logic level.

According to some embodiments, the voltages may include a common voltage commonly applied to the plurality of pixels. The common voltage may include a low potential common voltage ELVSS, a high potential common voltage ELVDD, an initialization voltage VINIT, and the like.

The high potential common voltage ELVDD may be a voltage for generating a driving current flowing through the light emitting element LE (see FIG. 4). The low potential common voltage ELVSS may be a voltage applied to the second electrode CE (see FIG. 4). The initialization voltage VINIT may be a voltage applied to a gate electrode of a transistor (e.g., corresponding to the gate electrode layer GAT shown in FIG. 4) or source electrode (or drain electrode) of a transistor (e.g., corresponding to first source-drain electrode layer SD1 shown in FIG. 4).

Meanwhile, a low potential voltage may include a ground voltage (0V), a negative voltage (minus voltage) lower than the ground voltage, or the like.

According to some embodiments, the voltages may include data voltage Vdata for allowing the plurality of pixels to display an image.

According to some embodiments, the voltages may include touch driving signals TX1, TX2, and TX3 input in a direction from the integrated circuit 610 to the substrate SUB to be input to the touch driving electrodes. In FIG. 17, a case where the touch driving signals TX1, TX2, and TX3 are output through three lines is illustrated as an example. However, the number of lines may vary.

According to some embodiments, the voltages may include touch sensing signals RX1, RX2, and RX3 input in a direction from the substrate SUB to the integrated circuit 610 to be input from the touch sensing electrodes. In FIG. 17, a case where the touch sensing signals RX1, RX2, and RX3 are output through three lines is illustrated as an example. However, the number of lines may vary.

Referring to FIG. 17, the display area side link line 815 may be electrically connected to a jumping line 1710 including a contact hole. According to a design, the jumping line 1710 may be omitted.

Referring to FIG. 17, the second non-display area NDA2 may include a first area 1720 and a second area 1730.

The first area 1720 may correspond to an area in which display area side contact parts 1720a and pad part side contact parts 1720b, to which a voltage for driving the scan driving circuit SCAN DRIVER is applied, are located.

The second area 1730 may correspond to an area in which display area side contact parts 1730a and pad part side contact parts 1370b, to which the common voltage is applied, are located.

Referring to FIG. 17, although a case where the first area 1720 is located outwardly of the second area 1730 is illustrated, the second area 1730 may be located outwardly of the first area 1720.

Although a case where the display area side contact parts 1720a to which the voltage for driving the scan driving circuit SCAN DRIVER is applied are located adjacent to each other on the substrate SUB is illustrated, the present disclosure is not s limited thereto.

Although a case where the pad part side contact parts 1720b to which the voltage for driving the scan driving circuit SCAN DRIVER is applied are located adjacent to each other on the substrate SUB is illustrated, the present disclosure is not limited thereto.

Although a case where the display area side contact parts 1730a to which the common voltage is applied are located adjacent to each other on the substrate SUB is illustrated, the present disclosure is not limited thereto.

Although a case where the pad part side contact parts 1730b to which the common voltage is applied are located adjacent to each other on the substrate SUB is illustrated, the present disclosure is not limited thereto.

For convenience of description, it is assumed and described that the contact parts 1720a and 1720b located in the first area 1720 are located adjacent to each other, and the contact parts 1730a and 1730b located in the second area 1730 are located adjacent to each other. However, the present disclosure is not limited thereto.

Hereinafter, descriptions of the first area 1720 may be applied identically to contact parts to which a signal input to the emission driving circuit EM DRIVER is applied.

Figure 18:
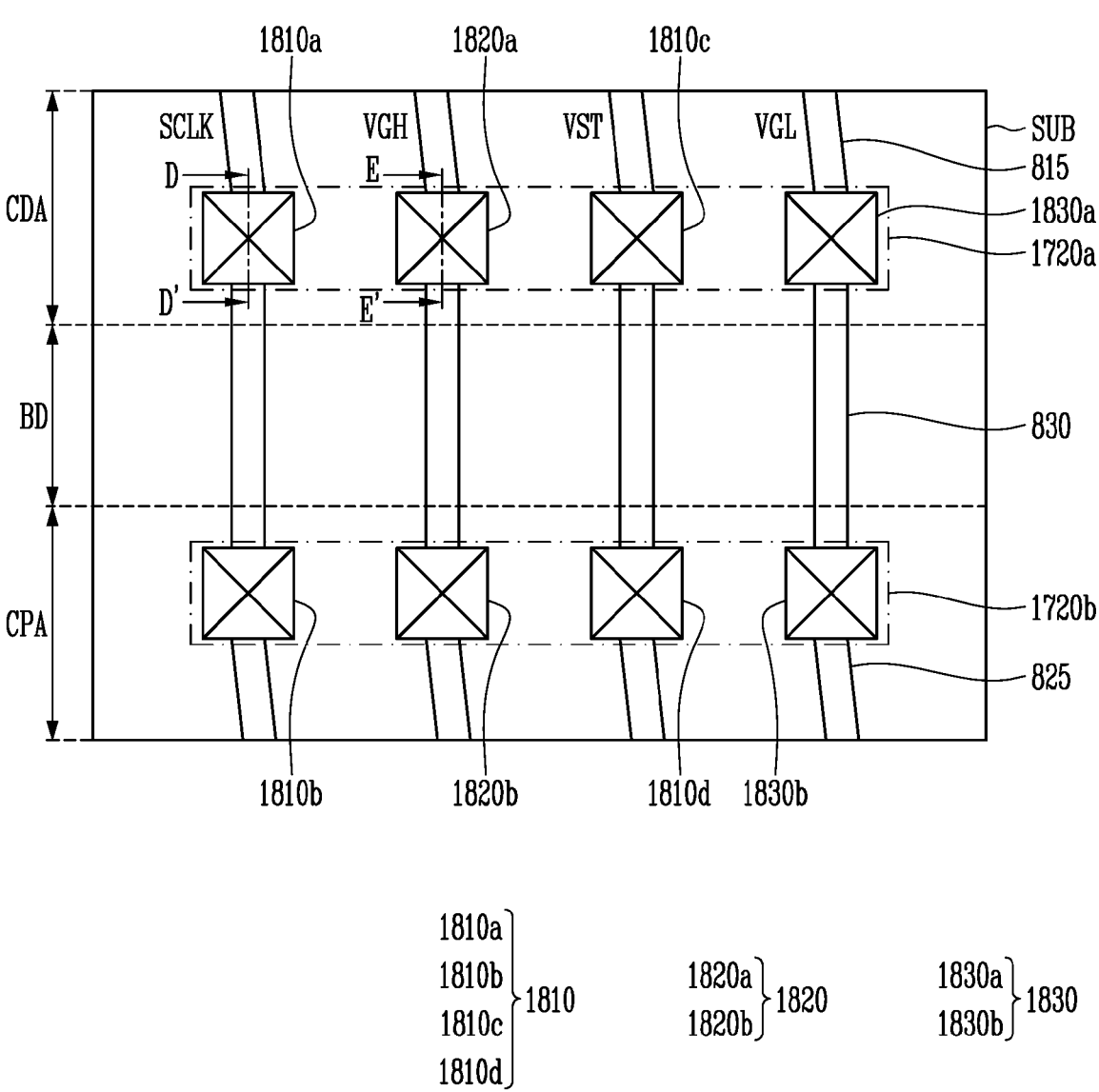
FIG. 18 is an enlarged view of a first area.

FIG. 18 is an enlarged view of the first area.

Referring to FIG. 18, contact parts (for example, first contact parts) 1810a and 1810b to which the scan clock signal SCLK is applied, contact parts (for example, second contact parts) 1820a and 1820b to which the high level gate voltage VGH is applied, contact parts (for example, third contact parts) 1810c and 1810d to which the start pulse VST is applied, and contact parts (for example, fourth contact parts) 1830a and 1830b to which the low level gate voltage VGL is applied are illustrated.

"Scan clock signal transfer contact parts (for example, first contact parts) 1810a and 1810b" to which the scan clock signal SCLK is applied may be included in a contact part 1810 to which a pulse signal is applied.

"Start pulse transfer contact parts (for example, second contact parts) 1810c and 1810d" to which the start pulse VST is applied may be included in the contact part 1810 to which the pulse signal is applied.

"Gate high voltage transfer contact parts (for example, third contact parts) 1820a and 1820b" to which the high level gate voltage VGH is applied may be included in a contact part 1820 to which a high potential DC voltage is applied.

"Gate low voltage transfer contact parts (for example, fourth contact parts) 1830a and 1830b" to which the low level gate voltage VGL is applied may be included in a contact part 1830 to which a low potential DC voltage is applied.

In the case of the contact part 1810 to which the pulse signal is applied, the potential of the link lines 815 and 825 and the connection line 830 continuously varies according to the potential of the pulse signal. Accordingly, the inorganic layer (e.g., the touch insulating layer) on the contact hole may be oxidized.

A signal having a constant voltage level may be continuously input to the contact part 1820 to which the high potential DC voltage is applied. Accordingly, the probability that the inorganic layer (e.g., the touch insulating layer) on the contact hole will be oxidized may be relatively low.

A signal having a constant voltage level may be continuously input to the contact part 1830 to which the low potential DC voltage is applied. Accordingly, the probability that the inorganic layer (e.g., the touch insulating layer) on the contact hole will be oxidized may be relatively low.

However, there may be a case where a contact part for transferring the low potential common voltage ELVSS is located adjacent to the contact part 1830 to which the low potential DC voltage is applied (see FIG. 17). Because a voltage difference between the low level gate voltage VGL and the low potential common voltage ELVSS exists, the inorganic layer (e.g., the touch insulating layer) on the contact hole may be oxidized.

As described above, this is as follows.

In the case of the contact part 1810 to which the pulse signal is applied, the probability that the inorganic layer on the contact hole will be oxidized may be relatively high, and therefore, the inorganic layer (e.g., the touch insulating layer) may be removed on the contact part 1810 to which the pulse signal is applied.

In the case of the contact parts 1820 and 1830 to which the DC voltage is applied, the probability that the inorganic layer on the contact hole will be oxidized may be relatively low, and therefore, the inorganic layer (e.g., the touch insulating layer) may not be removed on the contact parts 1820 and 1830 to which the DC voltage is applied.

According to some embodiments, the inorganic layer (e.g., the touch insulating layer) may be removed even on the contact parts 1820 and 1830 to which the DC voltage is applied.

Figure 19:
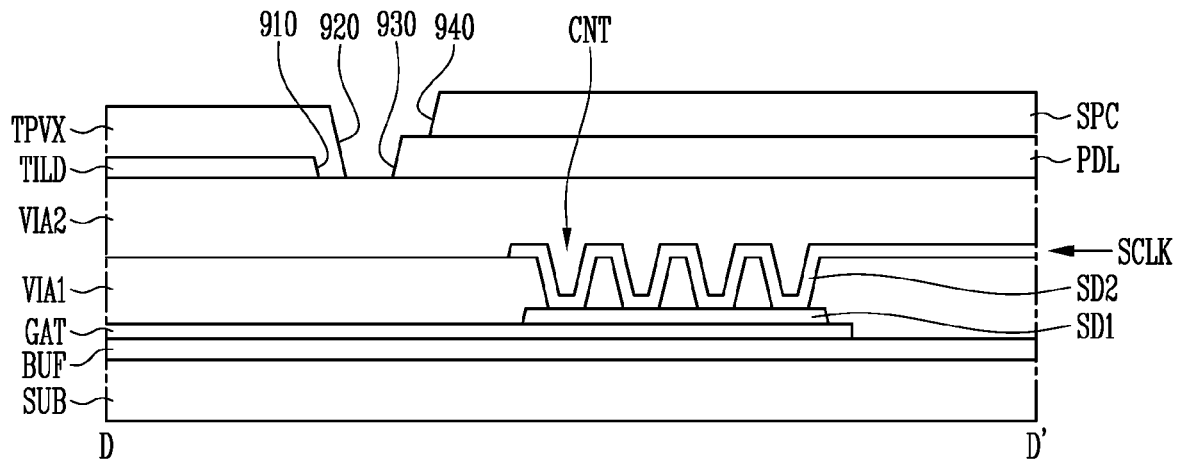
FIG. 19 is a sectional view of the display device taken along line D-D' shown in FIG. 18 according to some embodiments of the present disclosure.

FIG. 19 is a sectional view of the display device taken along line D-D' shown in FIG. 18 according to some embodiments of the present disclosure.

Referring to FIG. 19, the scan clock signal SCLK is applied to the second source-drain electrode layer SD2. Because the potential of the scan clock signal SCLK continuously fluctuates according to time, the inorganic layer (e.g., the touch insulating layer TILD) may be oxidized.

The one side end 910 of the touch insulating layer TILD may be located at an outside of the second source-drain electrode layer SD2 to which the scan clock signal SCLK is applied.

Figure 20:
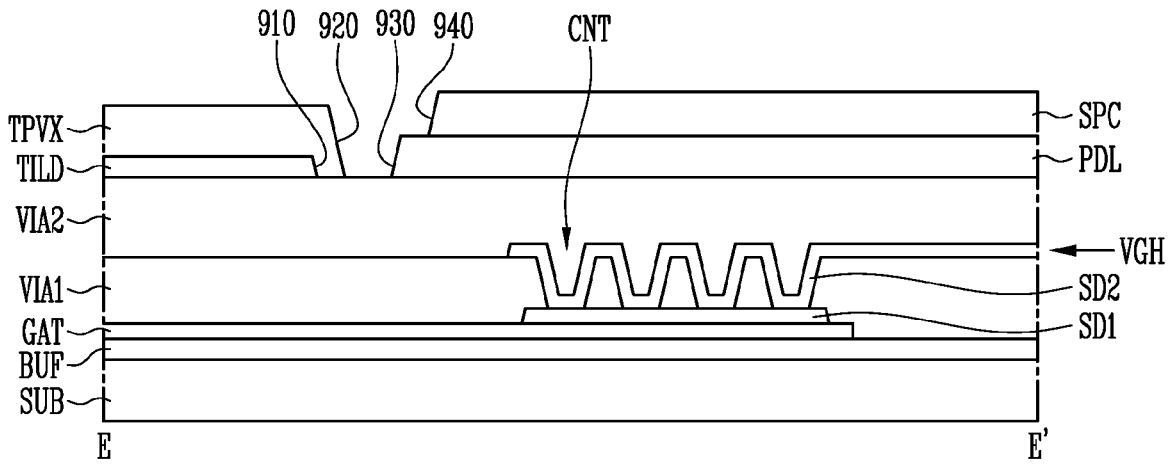
FIGS. 20 and 21 are sectional views of the display device taken along line E-E' shown in FIG. 18 according to some embodiments of the present disclosure.
Figure 21:
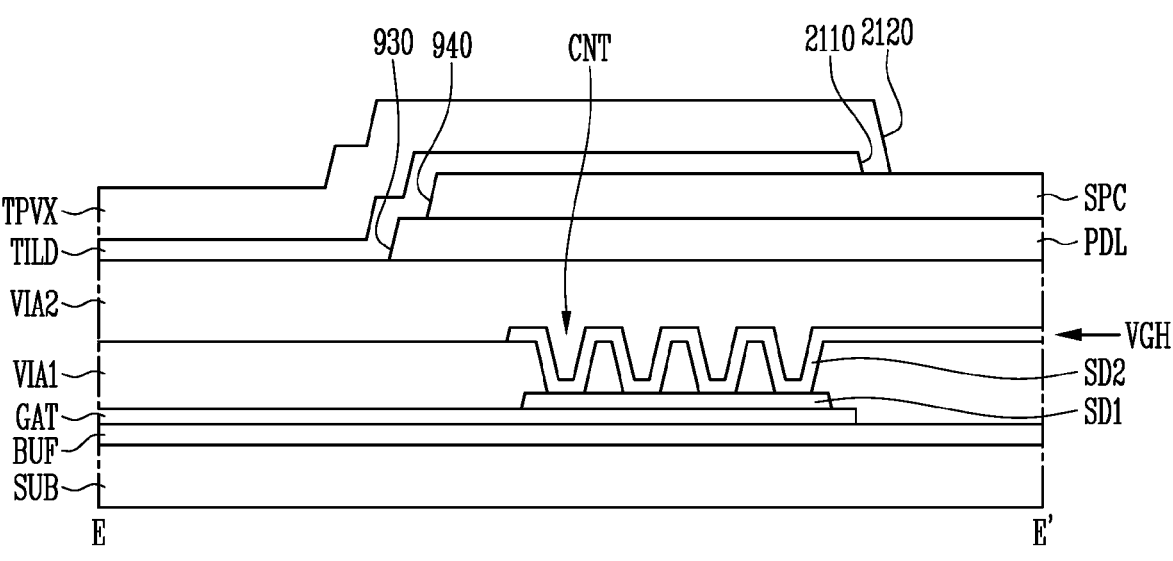

FIGS. 20 and 21 are sectional views of the display device taken along line E-E' shown in FIG. 18 according to some embodiments of the present disclosure.

The high level gate voltage VGH is applied to the second source-drain electrode layer SD2. The high level gate voltage VGH may be a DC voltage having a substantially constant voltage level.

The high level gate voltage VGH represents the DC voltage, and the embodiments shown in FIGS. 20 and 21 may be applied identically to the low level gate voltage VGL.

Referring to FIG. 20, the one side end 910 of the touch insulating layer TILD may be located at an outside of the second source-drain electrode layer SD2 to which the DC voltage is applied. For example, the one side end 910 of the touch insulating layer TILD may be located at an outside of the second source-drain electrode layer SD2 to which the high level gate voltage VGH is applied. For example, the one side end 910 of the touch insulating layer TILD may be located at an outside of the second source-drain electrode layer SD2 to which the low level gate voltage VGL is applied.

Referring to FIG. 21, one side end 2110 of the touch insulating layer TILD and/or one side end 2120 of the passivation layer TPVX may be located at an inside of the second source-drain electrode layer SD2 to which the DC voltage is applied. For example, the one side end 2110 of the touch insulating layer TILD may be located at an inside of the contact hole CNT to which the high level gate voltage VGH is transferred. For example, the one side end 2110 of the touch insulating layer TILD may be located at an inside of the second source-drain electrode layer SD2 to which the low level gate voltage VGL is applied.

Figure 22:
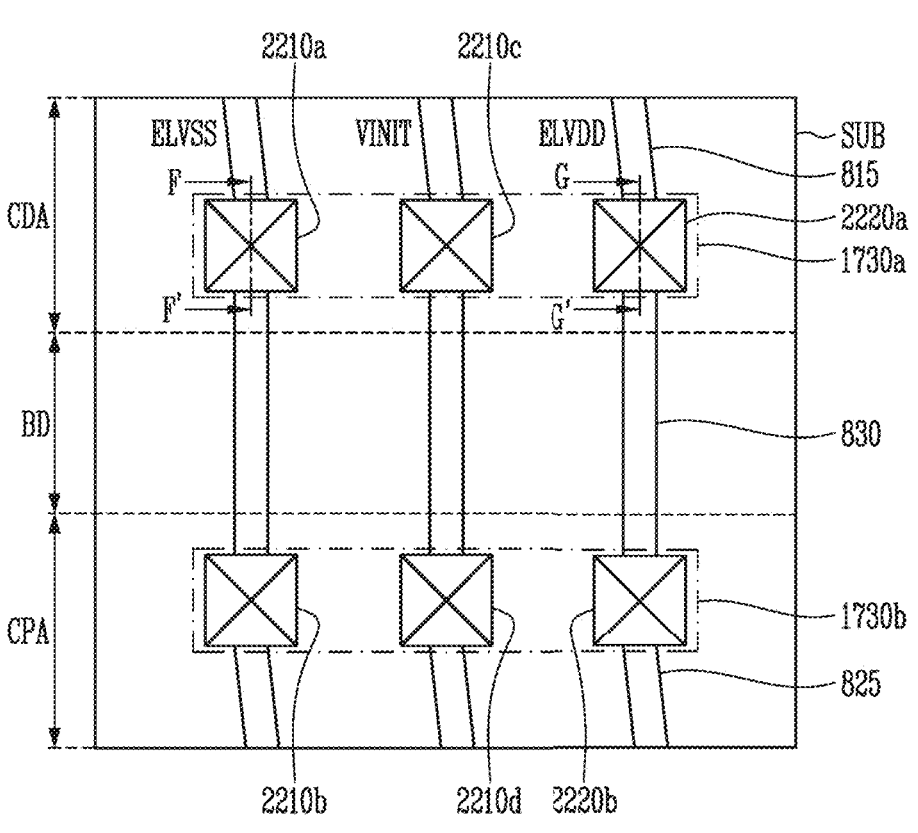
FIG. 22 is an enlarged view of a second area.

FIG. 22 is an enlarged view of the second area.

Referring to FIG. 22, contact parts (for example, sixth contact parts) 2210*a* and 2210*b* to which the low potential common voltage ELVSS is applied, contact parts (for example, seventh contact parts) 2210*c* and 2210*d* to which the initialization voltage VINIT, and contact parts (for example, eighth contact parts) 2220*a* and 2220*b* to which the high potential common voltage ELVDD is applied are illustrated.

The contact parts 2210*a* and 2210*b* to which the low potential common voltage ELVSS is applied may be included in a contact part 2210 to which a low potential DC voltage is applied.

The contact parts 2210*c* and 2210*d* to which the initialization voltage VINIT is applied may be included in the contact part 2210 to which the low potential DC voltage is applied.

The contact parts 2220*a* and 2220*b* to which the high potential common voltage ELVDD is applied may be included in a contact part 2220 to which a high potential DC voltage is applied.

Descriptions of the contact part 2210 to which the low potential DC voltage is applied is replaced with the descriptions of the contact part 1830 to which the low potential DC voltage is applied, which is described above in FIG. 18.

Descriptions of the contact part 2220 to which the high potential DC voltage is applied is replaced with the descriptions of the contact part 1820 to which the high potential DC voltage is applied, which is described above in FIG. 18.

Figure 23:
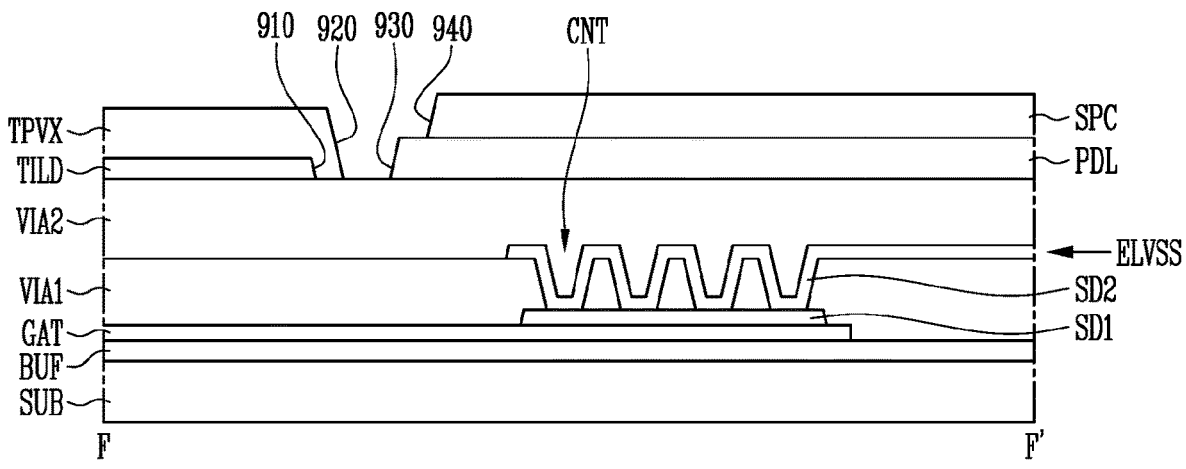
FIG. 23 is a sectional view of the display device taken along line F-F' shown in FIG. 22 according to some embodiments of the present disclosure.

FIG. 23 is a sectional view of the display device taken along line F-F' shown in FIG. 22 according to some embodiments of the present disclosure.

The low potential common voltage ELVSS is applied to the second source-drain electrode layer SD2. The low potential common voltage ELVSS represents the DC voltage, and the embodiments shown in FIG. 23 may be applied identically applied to the initial voltage VINIT and the high potential common voltage ELVDD.

Referring to FIG. 23, the one side end of the touch insulating layer TILD may be located at an outside of the second source-drain electrode layer SD2 to which the DC voltage is applied. For example, the one side end of the touch insulating layer TILD may be located at an outside of the second source-drain electrode layer SD2 to which the low potential common voltage ELVSS is applied. For example, the one side end of the touch insulating layer TILD may be located at an outside of the second source-drain electrode layer SD2 to which the initialization voltage VINIT is applied.

Figure 24:
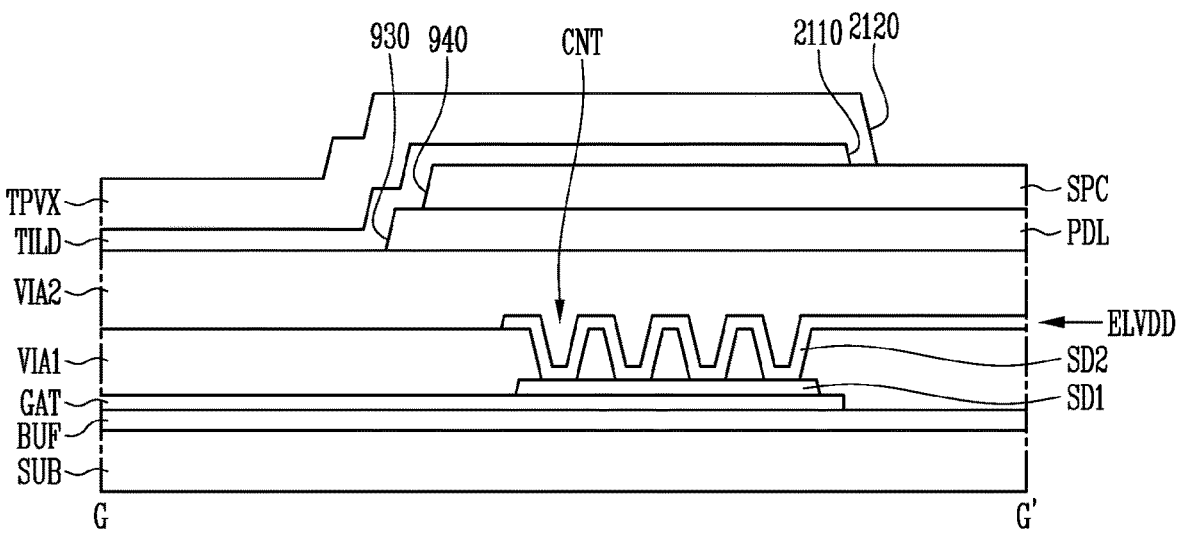
FIG. 24 is a sectional view of the display device taken along line G-G' shown in FIG. 22 according to some embodiments of the present disclosure.

FIG. 24 is a sectional view of the display device taken along line G-G' shown in FIG. 22 according to some embodiments of the present disclosure.

The high potential common voltage ELVDD is applied to the second source-drain electrode layer SD2. The high potential common voltage ELVDD represents the DC voltage, and the embodiments shown in FIG. 24 may be applied identically to the initialization voltage VINIT and the low potential common voltage ELVSS.

Referring to FIG. 24, the one side end 2110 of the touch insulating layer TILD may be located at an inside of the contact hole CNT to which the DC voltage is transferred. For example, the one side end 2110 of the touch insulating layer TILD may be located at an inside of the contact hole CNT to which the high potential common voltage ELVDD is applied.

Figure 25:
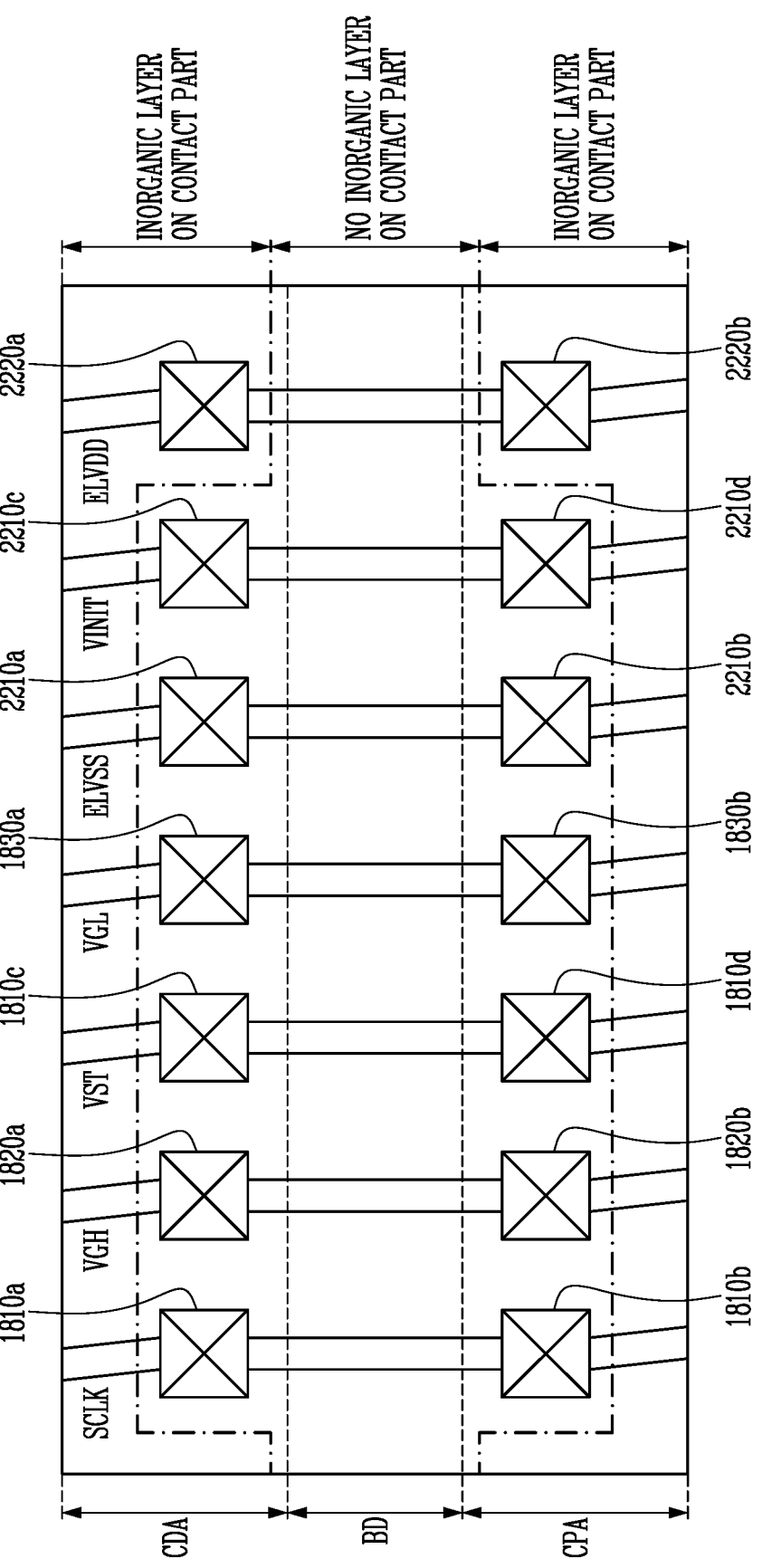
FIGS. 25 and 26 are views illustrating a line on which one side end of an inorganic layer is located at an outside of the bending area when the display device is viewed from the front according to some embodiments of the present disclosure.
Figure 26:
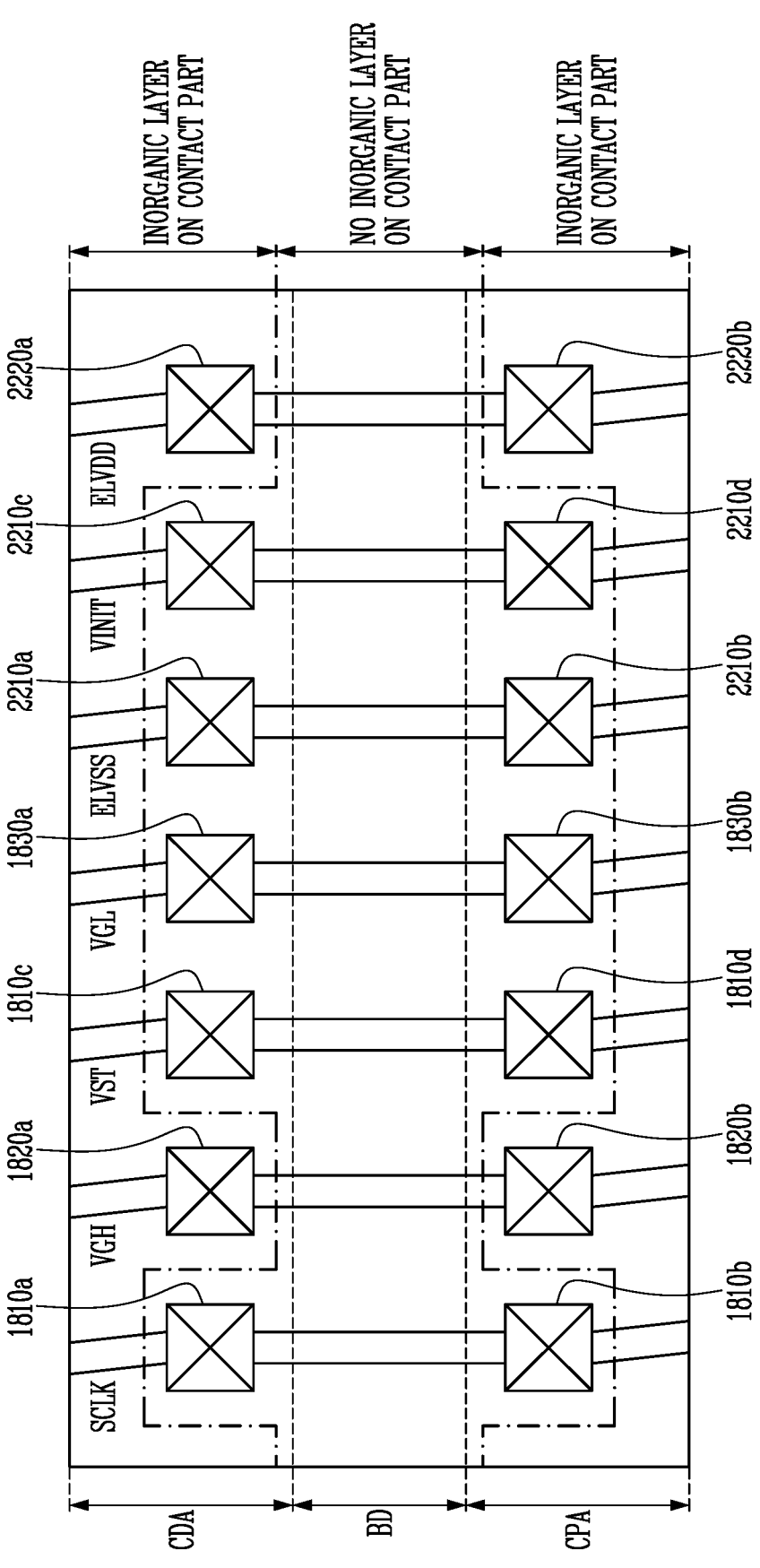

FIGS. 25 and 26 are views illustrating a line on which one side end of the inorganic layer is located at an outside of the bending area BD when the display device is viewed from the front according to some embodiments of the present disclosure.

Referring to FIG. 25, in the display device according to some embodiments of the present disclosure, at least a portion of the one side end of the inorganic layer may be located at an outside of the bending area BD, and be located at an outside of the display area side contact parts 1810*a*, 1820*a*, 1810*c*, 1830*a*, 2210*a*, and 2210*c*. In the display device according to some embodiments of the present disclosure, at least a portion of the one side end of the inorganic layer may be located at an outside of the contact parts 1810*a* and 1810*c* to which the pulse signal is applied. In the display device according to some embodiments of the present disclosure, at least a portion of the one side end of the inorganic layer may be located at an outside of the contact parts 1820*a*, 1830*a*, 2210*a*, and 2210*c* to which the DC voltage is applied.

Referring to FIG. 25, in the display device according to some embodiments of the present disclosure, the other portion of the one side end of the inorganic layer may be located between the bending area BD and the display area side contact part 2220*a*. In the display device according to some embodiments of the present disclosure, the other portion of the one side end of the inorganic layer may be located at an inside of the contact part 2220*a* to which DC voltage is applied. In the display device according to some embodiments of the present disclosure, the other portion of the one side end of the inorganic layer may be located at an inside of the contact part 2220*a* to which the high potential common voltage ELVDD is applied.

Referring to FIG. 25, in the display device according to some embodiments of the present disclosure, at least a portion of the other side end of the inorganic layer may be located at an outside of the bending area BD, and be located at an outside of the pad part side contact parts 1810*b*, 1820*b*, 1810*d*, 1830*b*, 2210*b*, and 2210*d*. In the display device according to some embodiments of the present disclosure, at least a portion of the other side end of the inorganic layer may be located at an outside of the contact parts 1810*b* and 1810*d* to which the pulse signal is applied. In the display device according to some embodiments of the present disclosure, at least a portion of the other side end of the inorganic layer may be located at an outside of the contact parts 1820*b*, 1830*b*, 2210*b*, and 2210*d* to which the DC voltage is applied.

Referring to FIG. 25, in the display device according to some embodiments of the present disclosure, the other portion of the other side end of the inorganic layer may be located between the bending area BD and the pad part side contact part 222*b*. In the display device according to some embodiments of the present disclosure, the other portion of the other side end of the inorganic layer may be located at an inside of the contact part 2220*b* to which the DC voltage is applied. In the display device according to some embodiments of the present disclosure, the other portion of the other side end of the inorganic layer may be located at an inside of the contact part 2220*b* to which the high potential common voltage ELVDD is applied.

Referring to FIG. 26, in the display device according to some embodiments of the present disclosure, at least a portion of the one side end of the inorganic layer may be located at an outside of the bending area BD and the display area side contact parts 1810*a*, 1810*c*, 1830*a*, 2210*a*, and 2210*c*. In the display device according to some embodiments of the present disclosure, at least a portion of the one side end of the inorganic layer may be located at an outside of the contact parts 1810*a* and 1810*c* to which the pulse signal is applied. In the display device according to some embodiments of the present disclosure, at least a portion of the one side end of the inorganic layer may be located at an outside of the contact parts 1830*a*, 2210*a*, and 2210*c* to which the DC voltage is applied.

Referring to FIG. 26, in the display device according to some embodiments of the present disclosure, the other portion of the one side end of the inorganic layer may be located between the bending area BD and the display area side contact parts 1820*a* and 2220*a*. In the display device according to some embodiments of the present disclosure, the other portion of the one side end of the inorganic layer may be located at an inside of the contact parts 1820*a* and 2220*a* to which the DC voltage is applied. In the display device according to some embodiments of the present disclosure, the other portion of the one side end of the inorganic layer may be located at an inside of the contact part 1820*a* to which the high level gate voltage VGH is applied and the contact part 2220*a* to which the high potential common voltage ELVDD is applied.

Referring to FIG. 26, in the display device according to some embodiments of the present disclosure, at least a portion of the other side end of the inorganic layer may be located at an outside of the bending area BD and the pad part side contact parts 1810*b*, 1810*d*, 1830*b*, 2210*b*, and 2210*d*. In the display device according to some embodiments of the present disclosure, at least a portion of the other side end of the inorganic layer may be located at an outside of the contact parts 1810*b* and 1810*d* to which the pulse signal is applied. In the display device according to some embodiments of the present disclosure, at least a portion of the other side end of the inorganic layer may be located at an outside of the contact parts 1830*b*, 2210*b*, and 2210*d* to which the DC voltage is applied.

Referring to FIG. 26, in the display device according to some embodiments of the present disclosure, the other portion of the other side end of the inorganic layer may be located between the bending area BD and the pad part side contact parts 1820*b* and 2220*b*. In the display device according to some embodiments of the present disclosure, the other portion of the other side end of the inorganic layer may be located at an inside of the contact parts 1820*b* and 2220*b* to which the DC voltage is applied. In the display device according to some embodiments of the present disclosure, the other portion of the other side end of the inorganic layer may be located at an inside of the contact part 1820*b* to which the high level gate voltage VGH is applied and the contact part 2220*b* to which the high potential common voltage ELVDD is applied.

Accordingly, in the display device 100 (see FIG. 1) according to some embodiments of the present disclosure, a contact failure of the metal layer ML (see FIG. 9) in the contact hole CNT (see FIG. 9) at the periphery of the bending area BD can be reduced.

In the display device and the touch display panel according to some embodiments of the present disclosure, a problem that the metal layer is corroded at the periphery of the display panel can be reduced.

Example embodiments have been disclosed herein, and although specific terms are employed, they are used and are to be interpreted in a generic and descriptive sense only and not for purpose of limitation. As would be apparent to one of ordinary skill in the art as of the filing of the present application, features, characteristics, and/or elements described in connection with particular embodiments may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, and their equivalents.

What is claimed is:

1. A display device comprising:
a substrate including a display area at a front surface and a non-display area at a periphery of the display area, wherein the non-display area includes a bending area having at least a portion bent toward a rear surface;
a first metal layer on the substrate, the first metal layer overlapping with a contact hole at an outside of the bending area in the non-display area;
a first via layer as an organic layer, located over the first metal layer, the first via layer including the contact hole;
a second metal layer on the first via layer, the second metal layer being electrically connected to the first metal layer in the contact hole;
an inorganic layer on the second metal layer, wherein at least a portion of one side end of the inorganic layer, which is in the non-display area, is at an outside of the bending area and an area on the contact hole;
a second via layer as an organic layer, located over the second metal layer, and
wherein the one side end of the inorganic layer is disposed between the display area and the bending area, and
wherein the inorganic layer is on the second via layer; and
a passivation layer over the inorganic layer,
wherein one side end of the passivation layer is at an outside of the bending area,
wherein the one side end of the passivation layer is between the one side end of the inorganic layer and the bending area.

2. The display device of claim 1, wherein the first metal layer and the second metal layer are configured with a metal having a triple layer structure.

3. The display device of claim 1, wherein the passivation layer covers the one side end of the inorganic layer.

4. The display device of claim 1, wherein the inorganic layer contacts the second via layer.

5. The display device of claim 1, further comprising a pixel defining layer on the second via layer, the pixel defining layer defining a plurality of pixels in the display area, wherein, in the non-display area, the one side end of the inorganic layer is spaced apart from the pixel defining layer.

6. The display device of claim 5, wherein the inorganic layer is on the pixel defining layer in the display area.

7. The display device of claim 5, wherein the one side end of the passivation layer is spaced apart from the pixel defining layer in the non-display area.

8. The display device of claim 5, wherein the one side end of the passivation layer is on the pixel defining layer and is at an outside of the bending area in the non-display area, and wherein the passivation layer includes a first inclined surface formed corresponding to a thickness of the pixel defining layer.

9. The display device of claim 5, wherein at least one of the plurality of pixels includes at least one light emitting element, wherein the light emitting element includes a first electrode on the second via layer, a light emitting layer on the pixel defining layer, and a second electrode on the light emitting layer, and wherein, in the display area, the inorganic layer is on the second electrode.

10. The display device of claim 9, further comprising an upper insulating layer on the second electrode, wherein the inorganic layer is on the upper insulating layer.

11. The display device of claim 10, wherein at least one dam configured to prevent overflow of the upper insulating layer is in the non-display area, and wherein the at least one dam includes the pixel defining layer and a spacer layer on the pixel defining layer.

12. The display device of claim 11, wherein, in the non-display area, the one side end of the inorganic layer is spaced apart from the spacer layer.

13. The display device of claim 12, wherein the one side end of the passivation layer is spaced apart from the spacer layer in the non-display area.

14. The display device of claim 12, wherein the one side end of the passivation layer is on the spacer layer and is at an outside of the bending area in the non-display area, and wherein the passivation layer includes a second inclined surface formed corresponding to a thickness of the spacer layer.

15. The display device of claim 14, wherein the passivation layer further includes:

a first horizontal surface connecting between a first inclined surface and a second inclined surface of the passivation layer; and a second horizontal surface connecting the second inclined surface to the one side end of the passivation layer.

16. The display device of claim 15, wherein the second horizontal surface overlaps the contact hole.

17. The display device of claim 1, wherein at least one thin film transistor on the substrate is in the display area, and wherein the first metal layer constitutes a source electrode and a drain electrode of the thin film transistor.

18. The display device of claim 17, wherein the thin film transistor includes:

a semiconductor layer including a source region electrically connected to the source electrode, a drain region electrically connected to the drain electrode, and a channel region between the source region and the drain region; and a gate electrode layer overlapping the channel region, the gate electrode layer constituting a gate electrode of the thin film transistor, and wherein the gate electrode layer overlaps the first metal layer and the contact hole in the non-display area.

19. The display device of claim 18, wherein the gate electrode layer overlaps the one side end of the inorganic layer.

20. The display device of claim 1, further comprising a scan driving circuit configured to output a scan signal of a high level gate voltage or a low level gate voltage to a plurality of pixels in the display area, based on a start pulse and a scan clock signal, which are input thereto, wherein, in a front view of the substrate, a first contact part, a second contact part, a third contact part, and a fourth contact part are in the non-display area, and wherein the second metal layer to which the scan clock signal is applied is at the first contact part, the second metal layer to which the start pulse is applied is at the second contact part, the second metal layer to which a voltage corresponding to a high logic level is applied is located at the third contact part, and the second metal layer to which a voltage corresponding to a low logic level is applied is located at the fourth contact part.

21. The display device of claim 20, wherein the one side end of the inorganic layer is at an outside of the first contact part.

22. The display device of claim 20, wherein the one side end of the inorganic layer is at an outside of the fourth contact part.

23. The display device of claim 20, wherein the one side end of the inorganic layer is at an outside of the third contact part.

24. The display device of claim 20, wherein the one side end of the inorganic layer overlaps the second metal layer constituting the third contact part on a vertical line.

25. The display device of claim 1, wherein a plurality of pixels in the display area are commonly applied with a high potential common voltage and a low potential common voltage, and wherein, in a front view of the substrate, a fifth contact part and a sixth contact part are in the non-display area, and wherein the second metal layer to which the high potential common voltage is applied is at the fifth contact part, and the second metal layer to which the low potential common voltage is applied is at the sixth contact part.

26. The display device of claim 25, wherein the one side end of the inorganic layer is at an outside of the sixth contact part.

27. The display device of claim 25, wherein the one side end of the inorganic layer overlaps the second metal layer constituting the fifth contact part on a vertical line.

28. The display device of claim 1, further comprising a first touch electrode on a front surface of the substrate, the first touch electrode having a signal for touch sensing, which is input thereto, wherein the inorganic layer covers the first touch electrode.

29. The display device of claim 28, further comprising an integrated circuit configured to output a signal applied to the first touch electrode, and configured to receive a signal applied from the first touch electrode to calculate a variation of capacitance.

30. The display device of claim 28, further comprising a second touch electrode electrically insulated from the first touch electrode by the inorganic layer, wherein the first touch electrode and the second touch electrode are in a same layer.

31. The display device of claim 28, further comprising a second touch electrode electrically insulated from the first touch electrode by the inorganic layer, wherein the first touch electrode, the inorganic layer, and the second touch electrode are sequentially stacked.

32. The display device of claim 31, further comprising an integrated circuit configured to output a signal applied to the first touch electrode, and configured to receive a signal applied from the second touch electrode to calculate a variation of capacitance formed between the first touch electrode and the second touch electrode.

33. The display device of claim 1, wherein the inorganic layer has a double layer structure of a first inorganic layer and a second inorganic layer.

34. A touch display panel comprising:

a display panel including a substrate, a light emitting element layer in which a light emitting element is located on the substrate, and a pixel driving circuit layer in which a thin film transistor configured to drive the light emitting element is located, the display panel having a display area and a bending area, which are defined therein, wherein at least one of a plurality of pixels including the light emitting element and a pixel driving circuit of the pixel driving circuit layer is in the display area, and the bending area in which the substrate is bent toward a rear surface is included in a non-display area at a periphery of the display area; and a touch panel including a first touch electrode at a front surface of the display panel and an inorganic layer covering the first touch electrode, wherein a contact hole overlapping a connection line of the display panel, which extends across the bending area, is located in the non-display area of the display panel, wherein the inorganic layer overlaps at least a partial area of the non-display area of the display panel, and one side end of the inorganic layer is at an outside of the bending area and the contact hole, wherein the one side end of the inorganic layer is disposed between the display area and the bending area, wherein the pixel driving circuit layer includes:

a semiconductor layer including a channel region overlapping with a gate electrode, and a source region and a drain region, which are at both sides of the channel region;

a first source-drain electrode layer constituting a source electrode electrically connected to the source region of the semiconductor layer and a drain electrode electrically connected to the drain region of the semiconductor layer;

a first via layer covering the first source-drain electrode layer;

a second source-drain electrode layer electrically connected to the first source-drain electrode layer in an area in which at least a portion of the first via layer is removed; and a second via layer as an organic layer, located over the second source-drain electrode layer, and wherein the inorganic layer is on the second via layer; and a passivation layer over the inorganic layer, wherein one side end of the passivation layer is at an outside of the bending area, wherein the one side end of the passivation layer is between the one side end of the inorganic layer and the bending area.

35. The touch display panel of claim 34, wherein the connection line is in a same layer as the first source-drain electrode layer or the second source-drain electrode layer.

36. The touch display panel of claim 34, wherein the touch panel includes the first touch electrode, the inorganic layer, and a second touch electrode insulated from the first touch electrode, which are sequentially stacked therein.

* * * * *